United States Patent
Clouthier et al.

(10) Patent No.: US 7,532,358 B2
(45) Date of Patent: May 12, 2009

(54) HARDWARE IMPLEMENTED LOSS-LESS PAGE DATA COMPRESSOR/DECOMPRESSOR

(75) Inventors: Scott C. Clouthier, Boise, ID (US); John H. Harris, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1214 days.

(21) Appl. No.: 10/341,821

(22) Filed: Jan. 14, 2003

(65) Prior Publication Data

US 2003/0160984 A1  Aug. 28, 2003

Related U.S. Application Data

(60) Provisional application No. 60/360,835, filed on Feb. 27, 2002.

(51) Int. Cl.
*G06F 15/00* (2006.01)
*B41J 1/00* (2006.01)

(52) U.S. Cl. .................. 358/1.9; 358/500; 358/1.15; 358/404; 358/444; 382/244; 382/246; 382/239; 341/63

(58) Field of Classification Search .............. 358/1.9, 358/500, 1.15, 404, 444; 341/59, 63; 382/244, 382/246, 239
See application file for complete search history.

(56) References Cited

U.S. PATENT DOCUMENTS

| | | | | |
|---|---|---|---|---|
| 5,585,944 A | * | 12/1996 | Rodriguez | 358/500 |
| 5,617,517 A | * | 4/1997 | Chi | 358/1.15 |
| 5,649,074 A | | 7/1997 | Welborn | 395/114 |
| 5,710,561 A | * | 1/1998 | Schmidt et al. | 341/63 |
| 6,304,339 B1 | | 10/2001 | Miller et al. | 358/1.9 |
| 6,373,583 B1 | | 4/2002 | Wood et al. | 358/1.14 |
| 7,088,369 B2 | * | 8/2006 | Champion et al. | 345/531 |

FOREIGN PATENT DOCUMENTS

| | | |
|---|---|---|
| EP | 0703549 | 3/1996 |
| EP | 1001612 | 5/2000 |
| EP | 1001613 | 5/2000 |

OTHER PUBLICATIONS

British Search Report dated Jul. 17, 2003.

* cited by examiner

*Primary Examiner*—King Y Poon
*Assistant Examiner*—Quang N Vo

(57) ABSTRACT

One embodiment of the invention is directed to a printer that is configured to interleave color plane data. The interleaved data is compressed, thereby forming compressed data having runs, seedrow copies and literals. In the compression process, commands are buffered to enable independent and simultaneous operation of a run module, a seedrow copy module and a literal module used in forming the compressed data.

6 Claims, 8 Drawing Sheets

HARDWARE IMPLEMENTED LOSS-LESS PAGE DATA COMPRESSOR/DECOMPRESSOR

RELATED APPLICATIONS

This application is a continuation of a U.S. provisional application having Ser. No. 60/360,835, filed Feb. 27, 2002 by the same inventors herein named.

TECHNICAL FIELD

This disclosure relates to a hardware implementation for a loss-less page data compressor and decompressor.

BACKGROUND

Systems that utilize loss-less compression techniques generally do not perform well on image data, such as photographs and other high-resolution graphics. While achieving 100:1 compression on data associated with text and business graphics (line art, bar charts, and the like), complex loss-less compression algorithms usually achieve less than a 2:1 compression of image data. Conversely, while data associated with photographs and other images can be compressed effectively with a "lossy" algorithm without significantly affecting perceptible image quality, lossy algorithms visibly degrade text data (such as by leaving visual artifacts), even at relatively low levels of compression. Moreover, lossy compression techniques do not achieve compression ratios as high as those generally expected where data is based on text images. Still further, the advantages of JPEG-like compression over other techniques are reduced when compressing image data that have been scaled using a pixel-replication scaling algorithm common to rasterized compound documents (e.g., 150 dot-per-inch ("dpi") image data scaled up to a resolution of 300-dpi or 600-dpi). Thus, while lossy algorithms perform well on image data, loss-less algorithms provide better results on text-based data.

Solutions that use a mix of lossy and loss-less data compression are often slow and complex. For example, text and image data are sometimes separated to different channels, one containing the images using a lossy compression technique, like JPEG, and the other using a loss-less compression technique better-suited for text and simple business graphics. This separation of data into individual channels can be slow and the results are dependent on the architecture of the rasterization engine that initially rasterized the compound document. Moreover, the use of a lossy algorithm reduces data processing speeds, which slows the performance of devices configured to output "hard copies" onto print media. Again, the advantages of a JPEG-type algorithm are reduced for images that have been scaled. Moreover, the relatively slow nature of JPEG is not improved even when compressing high resolution pixel replicated image data.

Thus, currently known compression and decompression techniques fail to provide satisfactory results in many applications.

SUMMARY

One embodiment of the invention is directed to a printer that is configured to interleave color plane data. The interleaved data is compressed, thereby forming compressed data having runs, seedrow copies and literals. In the compression process, commands are buffered to enable independent and simultaneous operation of a run module, a seedrow copy module and a literal module used in forming the compressed data.

BRIEF DESCRIPTION OF THE DRAWINGS

The same numbers are used throughout the drawings to reference like features and components.

DETAILED DESCRIPTION

U.S. Pat. No. 6,304,339 by Miller, et al., which issued Oct. 16, 2001 and was assigned to the Hewlett-Packard Company, is hereby incorporated by reference. The Miller '339 reference describes a software implementation of a near loss-less compression algorithm, which experiences some loss in the blue color plane. U.S. Pat. No. 6,373,583 by Wood, et al., which issued Apr. 16, 2002 and was assigned to the Hewlett-Packard Company, is hereby incorporated by reference. The Wood '583 reference describes data compression for compound documents. Provisional application 60/360,835, filed Feb. 27, 2002, by the same inventors and assigned to the Hewlett-Packard Company, is also incorporated by reference.

Figure 1:
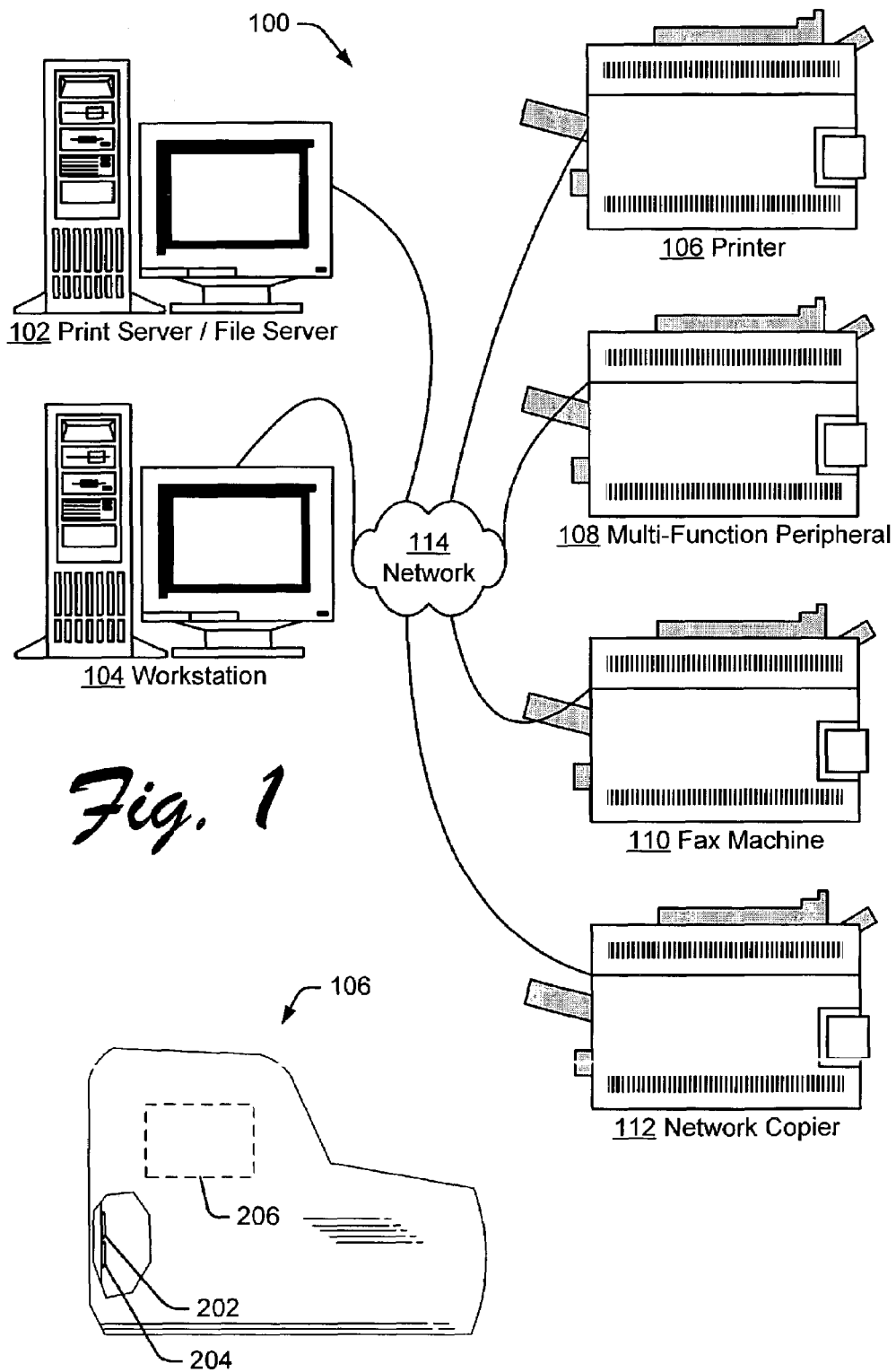
FIG. 1 illustrates an environment in which a version of the hardware implemented loss-less page data compressor/decompressor may be implemented.

FIG. 1 shows a network environment 100 in which a printer or other device may be configured to employ hardware implemented loss-less page data compression and decompression. A print server or file server 102 is configured to receive a print job, from any of a plurality of workstations 104 over a network 114. The print job may be sent to an output device configured to employ hardware implemented loss-less data compression and decompression. Such an output device may be in any form, such as a printer 106, multifunctional peripheral 108, fax machine 110, network copier 112 or other device.

Figure 2:
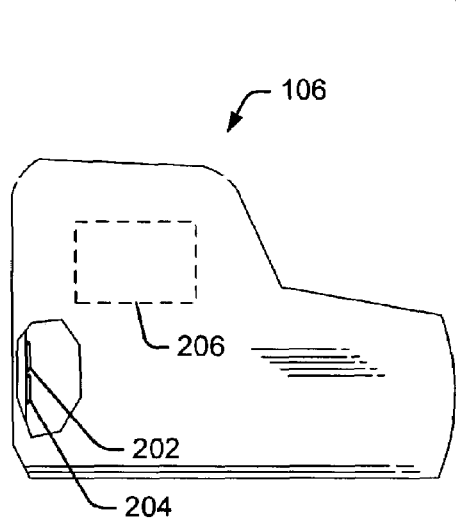
FIG. 2 is an illustration of an exemplary printing device within which is embodied a version of the hardware implemented loss-less page data compressor/decompressor.

FIG. 2 shows an exemplary printer 106 having an application specific integrated circuit (ASIC) 202 configured to implement loss-less data compression and decompression. A controller 204 and print engine 206 communicate with the ASIC 202 to result in print output. While FIG. 2 shows the ASIC 202 implemented in the printer 106, any output device, such as those seen in FIG. 1, could alternatively be substituted. Similarly, while the implementation in an ASIC is typically preferred for reasons of speed and economics, a general purpose processor or controller could be substituted in some applications.

Figure 3:
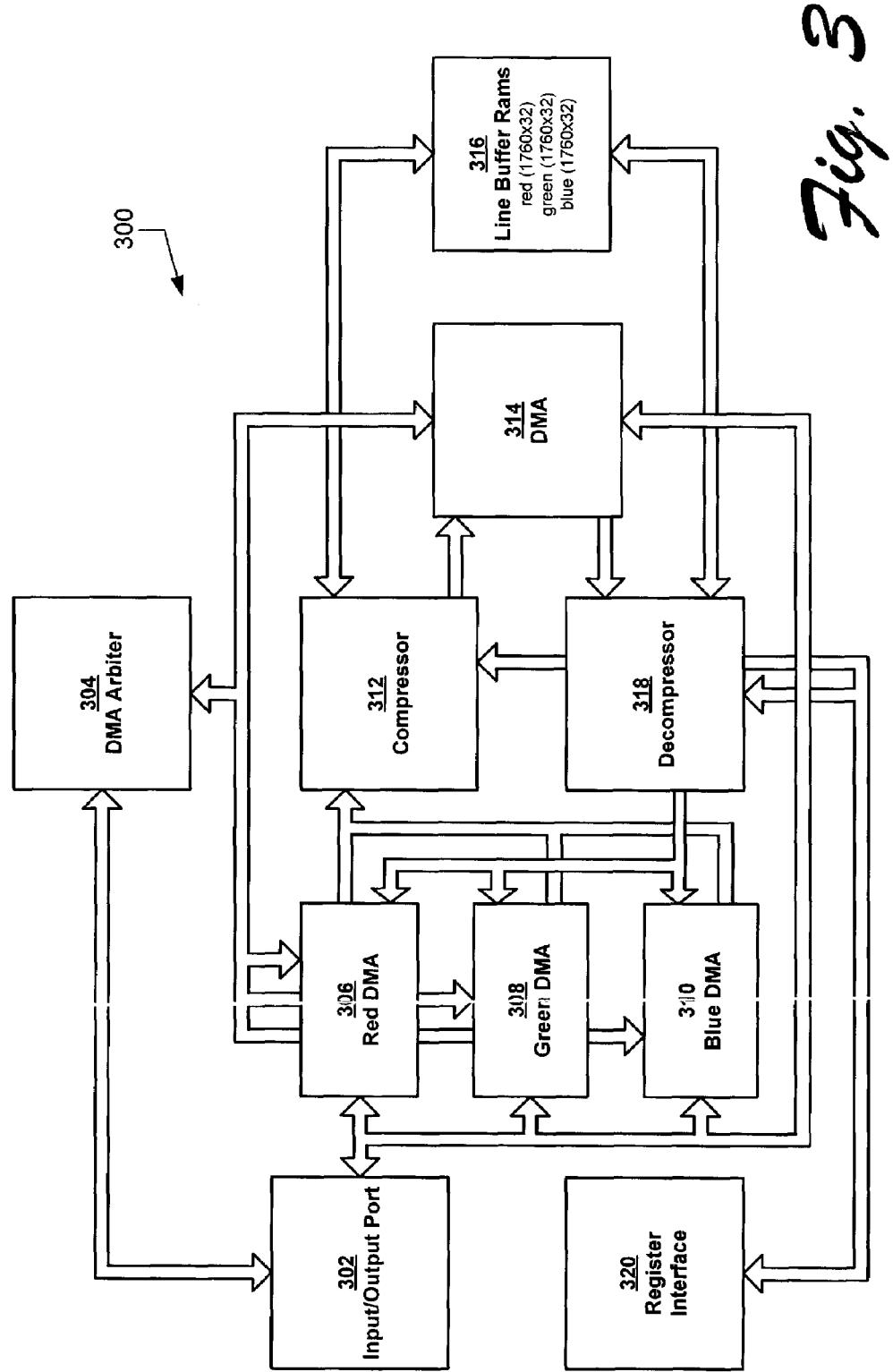
FIG. 3 is a block diagram that illustrates an example of possible top level components in a hardware implementation of a device for compression and decompression of color plane data.

FIG. 3 shows a block diagram that illustrates top level components in an implementation 300 of a device 202 for compression and decompression of color plane data. The device may be configured in hardware as an application specific integrated circuit (ASIC) or configured to operate on an alternative hardware device executing instructions.

An input/output port 302 allows data to be received into and sent from the compression and decompression device. For example, color plane data may be received through port 302 from a source, such as an interpreter translating page description language into device ready bits. After compression, the compressed data may pass through port 302, typically destined for a storage location. The compressed data may again pass through port 302 to allow decompression. After decompression, the decompressed data may pass a final time through port 302 on the way to a print engine. This data traffic is regulated in part by a DMA (direct memory access) arbiter 304, which parses color plane data and coordinates for DMAs 306, 308, 310 and DMA 314 and their access to the input/output port 302, thereby allowing data to be moved in an orderly fashion.

A compressor 312 is configured to receive data from DMA units 306, 308, 310, and compresses the data, using line buffers 316 in some operations. Output from the compressor 312 is sent through the DMA units and the port 302, typically to a storage location.

A decompressor 318 is configured to receive compressed data, recalled through the port 302 and DMA 314. The decompressor 318 decompresses the data into 3 output planes—in one implementation at one pixel per clock cycle—and the 3 decompressed planes are then transferred out the port 302 by DMAs 306-310.

A register interface 320 allows programming of variables and/or registers within the compressor 312 and decompressor 318, thereby controlling such factors as pixels per line and other parameters.

Figure 4:
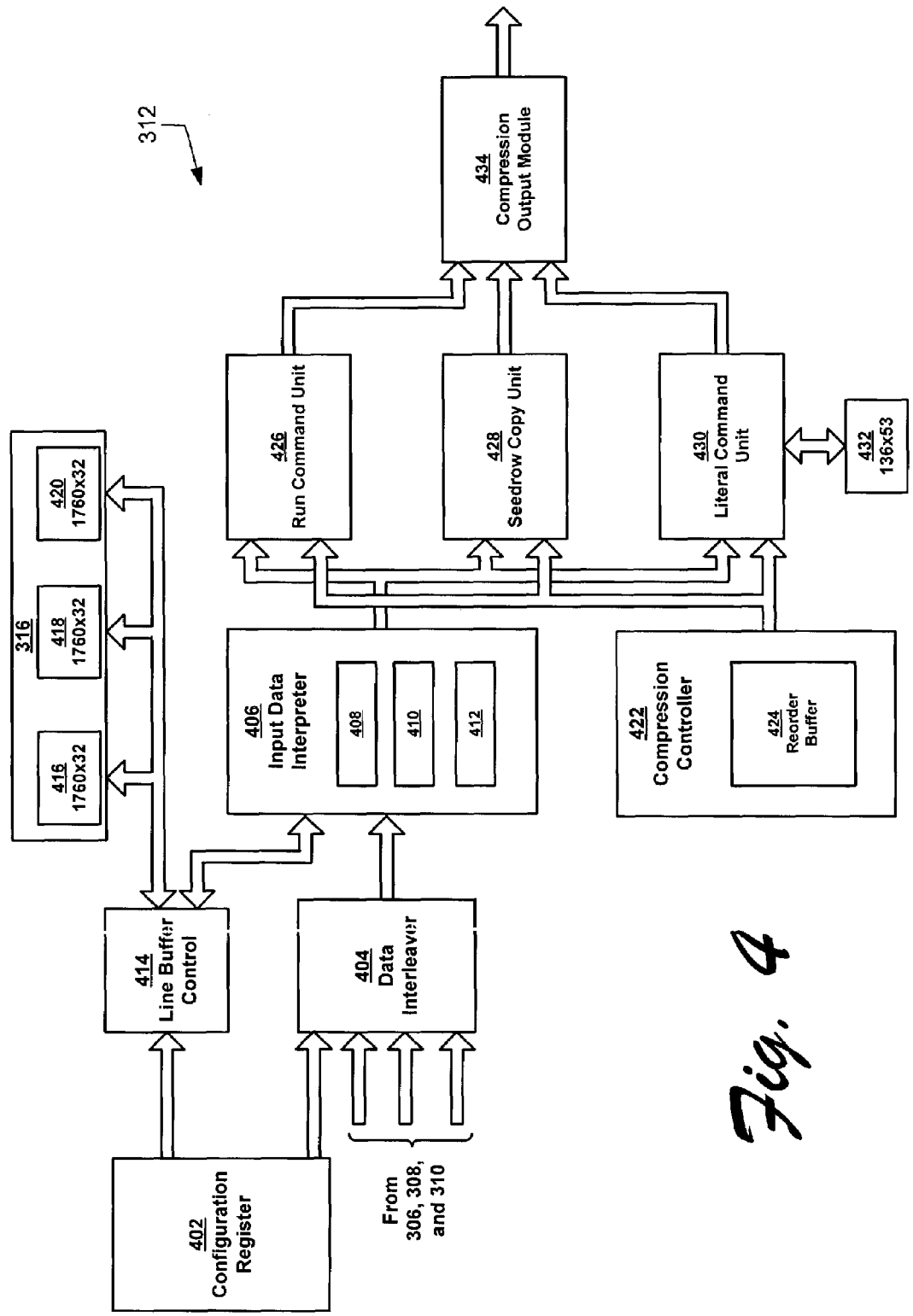
FIG. 4 is a block diagram that illustrates an example of a possible implementation of the compressor seen in FIG. 3.

FIG. 4 shows a block diagram that illustrates details of one embodiment of the compressor 312 seen in FIG. 3. Configuration register 402 contains control and data registers used within the compressor 312. The image size (bytes per line and lines per strip), initial seedrow pixel, and compression mode are programmable parameters configured within the configuration register 402. Address decoding for DMA registers is also generated in the configuration register 402. An interrupt enable register and status register is also contained in the configuration register 402.

A data interleaver 404 is responsible for interleaving the red, green, and blue data from the three DMAs 306, 308, 310 into a single stream. By interleaving the color data, the data interleaver 404 combines three streams of planar data into a single stream consisting of interleaved data, in a form such as RGB, RGB, RGB . . . , where R, G and B represent data associated with red, green and blue data from the three DMAs 306, 308, 310, respectively. Note that alternate colors could be substituted, such as CMY (cyan, magenta, yellow) or those found in other 3-dimensional color spaces. Each of the three input channels has two buffers within the data interleaver 404 to store input data. Transfers from each of the DMA channels consist of four bytes of data from the same color plane. Transfers from data interleaver 404 consist of four bytes of interleaved data. Since a pixel is made up of three bytes (RGB), the output word must be packed with one of the three combinations: (RGBR, GBRG, BRGB). Note that alternate colors could be substituted for RGB, such as CMY (cyan, magenta, yellow), and that RGB is meant to indicate three different colors, not a requirement for specific colors. A controller within the data interleaver 404 is configured to cycle through the three combinations to maintain the correct order. The end of image (EOI) marker that comes from each of the three DMA channels can be stored within color data, such as including the marker within a byte of blue data.

An input data interpreter 406 interprets interleaved color data received from the data interleaver 404. Upon receipt, interleaved data is stored in one of four input buffers. The interpreter 406 is configured to compare the buffered data against a seedrow pixel stored in a line buffer 416-420. Signals indicating a seedrow match of the current pixel, the next pixel, and the pixel two ahead are generated as appropriate. The input data interpreter 406 is also configured to detect a run of the current pixel with the next pixel, and the next pixel with the pixel two ahead. Run bytes are stored in one of two ping-pong buffers and multiplexed out and sent to the run command unit 426. The pixel caching comparisons (northeast, west, cache, new) are also made in the input data interpreter 406 and the encoded output is sent to the literal unit 430.

An entropy module 408, 410, 412 for each of the three pixel streams is also contained in the input data interpreter 406. The entropy modules 408-412 perform a measurement of the effectiveness of the compression, which supports the option of aborting the compression process when it is less effective. The entropy module counts changes between sequential pixels to determine a measure of entropy on a line basis. Multiple lines may be averaged together to obtain a broader measure of the entropy. The input data interpreter 406 may be configured to allow selection of the maximum number of lines used in the calculation. The entropy module 408-412 is instantiated three times inside of the input data interpreter 406, one time for each color plane.

A line buffer control 414 is configured to control access to and from the line buffer RAM buffers 416-420 that are used to store data representing the seedrow. Seedrow comparisons are made during a process which includes writing a current line of pixel data into the buffers 416-420 concurrently with a reading of the previous line of pixel data. A logical RAM storage area for each color plane is present, i.e. three RAM areas, each having its own controller. Buffering is provided for data that is written to the RAM to convert each byte stream of data into 32-bit data. Where the RAM data width is 32-bits (i.e. 4 bytes) the number of accesses needed is not prohibitive. Buffering is also provided for data being written from the RAM because the input data interpreter 406 needs data for the current pixel, the pixel one ahead of the current pixel, and the pixel two ahead of the current pixel. This data is needed to allow seedrow comparisons to be made.

A main compression controller 422 is configured to determine whether a pixel should be encoded as part of any of three types of compressed data: a run, a seedrow copy, or a literal. A seedrow copy means that the current byte is the same as the decoded byte on the previous row. A run describes a decompressed byte that is the same as the previous byte. A literal is a decompressed byte that is not a seedrow copy and is not part of a run. A seedrow copy is always part of a run or a literal, unless the seedrow copy extends to the end of the line. In this case, the command specifying the seedrow copy specifies only a seedrow copy.

A reorder buffer 424 is configured to store up to eight commands; such buffering of commands allows the run, seedrow copy and literal units 426, 428, 430 to operate concurrently. The reorder buffer 424 keeps track of which unit 426-430 should be allowed to write data to the compression output module 434. The seedrow copy and run counts are also computed in reorder buffer 424. In the embodiment of FIG. 4, there are four seedrow count buffers and two run count buffers, although alternate configurations could be substituted. A circular pointer is configured to point to the buffer that is currently in use. The seedrow copy count is used by the run, seedrow copy and literal units 426, 428 and 430. The run count is only used by the run unit 426.

The run command unit 426 is configured to encode run commands and to output run count bytes or terminating zeros. This functionality may be performed by use of a run command state machine which may also perform data transfers and handshaking with the compression output module 434. The run command unit 426 will output at most one data pixel per run command but may not output a data pixel if it is encoded as a west, northeast, or cached pixel. If seedrow copy pixels are to be encoded as part of the run command, the run command state machine uses the total seedrow copy count from the compression controller 422 and ensures the count is correctly encoded. Like the literal unit 424, two consecutive run operations can be performed before the run command unit 426 will have to stall and wait for the first pending command to be output. The end of image (EOI) marker is also generated by run command unit 426 when the last pixel(s) to be coded is part of a run.

The seedrow copy unit 428 is configured to encode seedrow copy commands and to output seedrow count bytes or terminating zeros. This functionality is performed by a seedrow copy state machine that also handshakes data transfers with the output unit 428. Unlike the run or literal units 426, 430, no actual data pixels are output from the seed row copy unit 428. Instead, a code indicating the need to copy the seed row is output. Like the literal command unit 430, two consecutive seedrow copy operations can be performed before the unit will have to stall and wait for the first pending command to be output, although an alternative configuration could be instantiated. The end of image (EOI) marker may also be generated by seedrow copy unit 428 when the last pixel(s) to be coded is part of a seedrow copy.

The literal unit 430 uses an internal RAM (136×53 bits) device 432 to batch literal pixels. The RAM device 432 stores up to 255 pixels which are written into the compressed stream if they cannot be encoded by the run command unit 426 (because they are not a run) or the seedrow copy unit 428 (because they are not part of a seedrow copy). The literal unit 430 is responsible for setting up data that is written to RAM 432 and for reading data out of the RAM 432. Every other pixel is registered from the input interpreter module 406 which allows 2 pixels (48 bits) to be written to the RAM 432 at a time. Since some literal pixels can be encoded, a flag is used to mark each pixel in RAM as a valid pixel that will be output. Buffering is provided to permit the encoding of two consecutive literal operations. A literal command state machine can be utilized to control the encoding of the literal command and writing of data pixels to the output unit 434. If seedrow copy pixels are to be encoded as part of a literal command, the literal command state machine uses the total seedrow copy count from the compression controller 422 and ensures the count is correctly encoded. The end of image (EOI) marker is also generated by literal unit 430 when the last pixel(s) to be coded is a literal pixel.

The compression output module 434 is responsible for buffering the compressed output data from the run, seedrow and literal copy units 426, 428, 430 and sequencing it for transmission in the correct pixel order to the outbound DMA 314. The compression output module 434 contains a 16-byte FIFO buffer where run, seedrow copy or literal data is stored until the DMA 314 requests the data. In one implementation, the compression output module 434 is configured to receive 1, 3, or 6 bytes of data. A transfer of one byte can occur from any of the three units (run unit 226, seedrow copy unit 428 or the literal unit 430). A transfer of 3 bytes (1 pixel) can occur from the run unit 426 or the literal unit 430. A transfer of 6 bytes (2 pixels) can only occur from the literal unit 430. These transfer quantities could be altered to fit a desired application.

Figure 5:
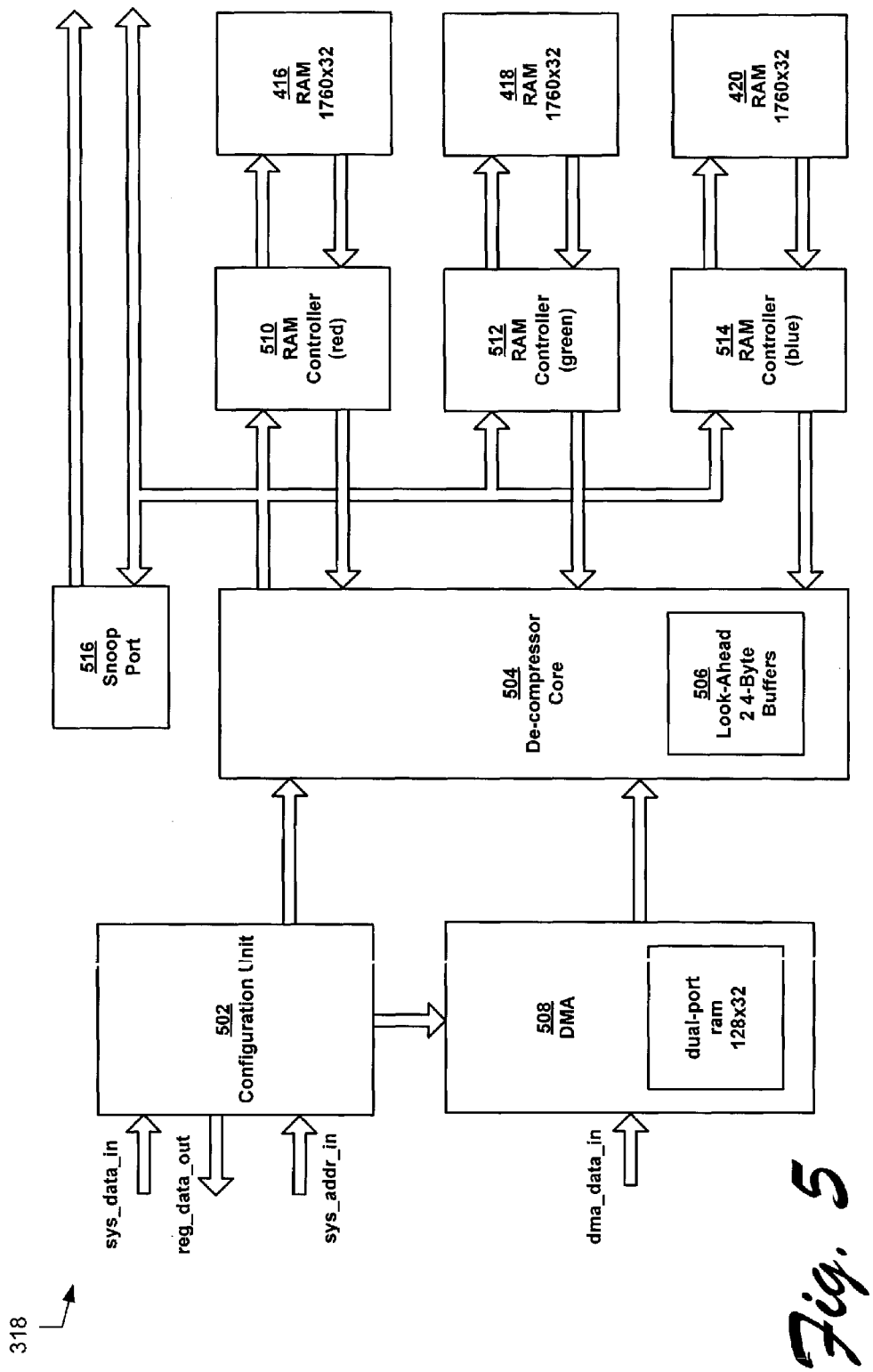
FIG. 5 is a block diagram that illustrates an example of a possible implementation of the decompressor seen in FIG. 3.

FIG. 5 shows a block diagram that illustrates details of the decompressor 318 seen in FIG. 1. A configuration unit 502 typically contains control and data registers for the decompressor 318. The image size (bytes per line and lines per strip), initial seedrow pixel, and compression mode may be programmable parameters. Address decoding for the DMA registers could be generated in this module or in the compression module 312. The interrupt enable register and status register may also be contained in the configuration unit 502.

A decompressor core 504 provides functionality that is essential for the operation of the decompressor 318. The decompressor core 504 accepts a compressed stream of 32-bit words from the input DMA 508 and outputs a stream of 32-bit words of decompressed pixels to RAM controllers 510, 512, 514 associated with each color plane (red, green and blue). The decompressed pixel stream is written to the line buffer RAMs 416, 418, 420 associated with the controllers 510-514 to allow for identification of seedrow or northeast encoded matches of pixels from the next line.

An exemplary design of the decompressor core 504 can be understood by reference to four parts. The first part consists of load equations which are configured to run in parallel, and thereby to detect all possible cases for runs, seedrow copies and literals. The load equations may operate asynchronously and the load equations may include buffers to allow looking-ahead, i.e. examination of pixel data associated with not-yet-decompressed pixels in the course of decompressing data associated with a current pixel (i.e. a pixel having data that is currently being decompressed). The second part includes combinatorial equations configured to control the data flow in and out of the block to/from the line buffers 316, the DMA 508, and downstream devices including the red, green and blue DMAs 306, 308, 310 shown in FIG. 3. The third section consists of registers configured to be loaded based on the load equations.

The fourth part is a decompressor state machine 600, which tracks and directs the current operation of the decompressor 318, and is more fully discussed below with reference to FIG. 6. The decompressor state machine 600 is configured to decompress pixels in sequence, and in doing so to look-ahead sufficiently (i.e. to look at not-yet-decompressed pixel data in the course of decompressing a sequence of pixel data) to determine how current compressed pixel data should be decompressed. In the implementation of the decompressor core 504 of FIG. 5, a look-ahead buffer 506 includes two 4-byte buffers which allow storage of data associated with pixels not yet decompressed to assist in the decompression of current pixel data. In the implementation disclosed, the decompressor state machine 600 is configured to output decompressed data associated with one pixel each clock cycle of the hardware, such as an ASIC, in which the decompressor 318 is instantiated.

The RAM controllers 510, 512, 514 control accesses to and from the line buffer RAMs 416, 418, 420 that are used to store seedrow data. The current line of decompressed pixel data is written into the RAM 510-514 at the same time as the previous line of pixel data are read. A pixel from the line buffer is used if a seedrow copy or NE (northeast) match is detected. Since there is a RAM 416, 418, 420 for each color plane, there are three RAMs—each with its own controller 510-514. In the implementation seen, buffering is provided for data that is written to the RAM to convert each byte data stream into 32-bit data. Use of RAM data having a width of 32-bits (4 bytes) allows memory accessing to be performed at an acceptable rate. Buffering is also provided for data being written from the RAM because the decompressor core 504 needs data associated with the current pixel, the pixel one ahead, and the pixel two ahead so the load equations can be utilized.

A snoop port 516 allows decompressed pixels to be observed outside the hardware implementation 300 of the compressor/decompressor, and can be used for debugging purposes.

Figure 6:
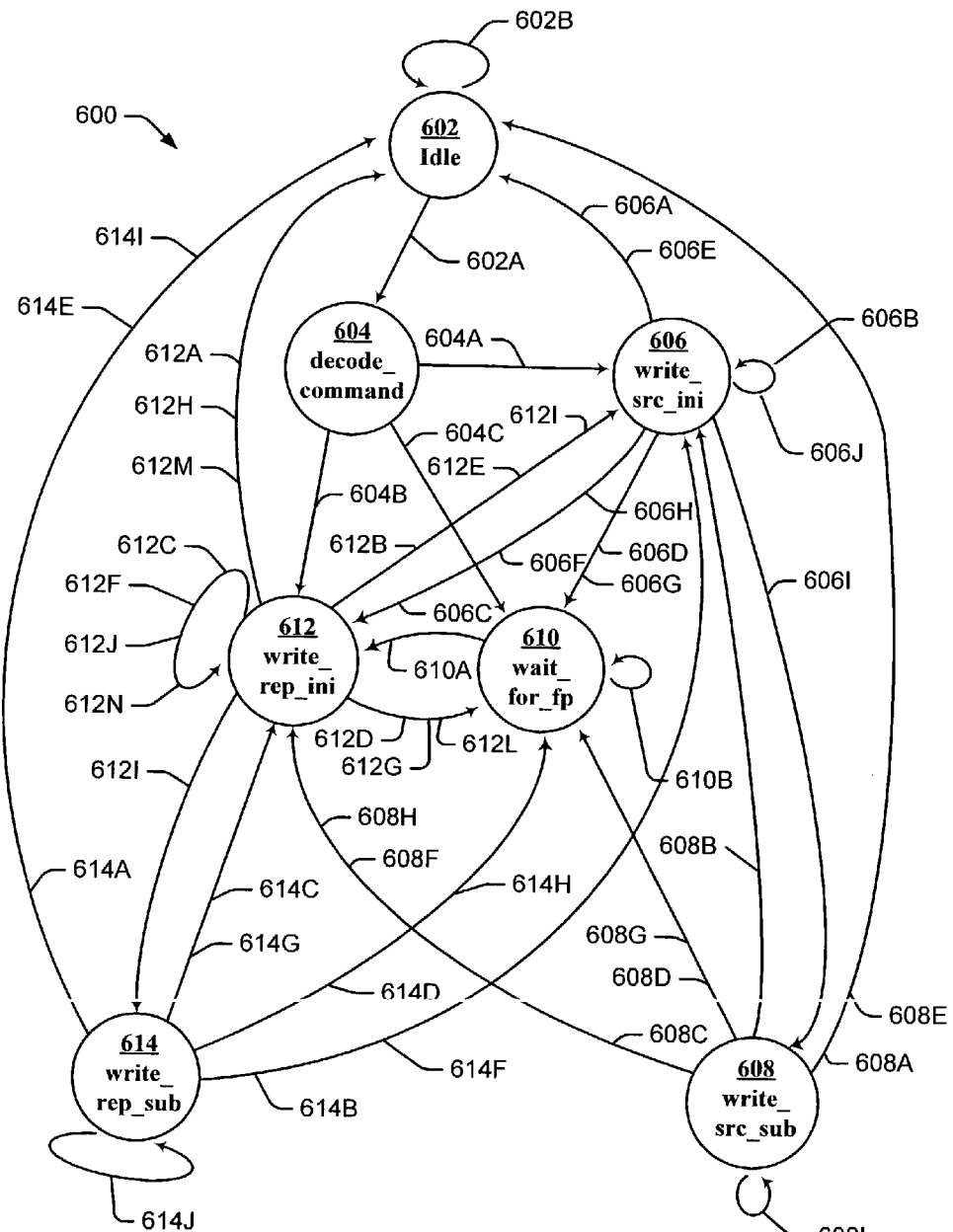
FIG. 6 is a block diagram that illustrates an example of a possible implementation of a state machine implemented in the decompressor of FIG. 5.

FIG. 6 shows a block diagram that illustrates details of a state machine 600 implemented in the decompressor core 504 of FIG. 5. Seven states are disclosed, including an IDLE state 602, a DECODE_COMMAND state 604, a WRITE_SRC_INI (write seedrow copy initial) state 606, a WRITE_SRC_SUB (write seedrow copy subsequent) state 608, a WAIT_FOR_FP (wait for first pixel) state 610, a WRITE_REP_INI (write replacement initial) state 612 and a WRITE_REP_SUB (write replacement subsequent) state 614.

Transfer between states within the state machine is governed by the evaluation of Boolean equations, which may consist of terms that include load equations, registers, flags, signals, expressions, etc. Each state within the state machine is associated with at least one Boolean expression, and each of these Boolean expressions is associated with a state to which the state machine could transfer. For example, state "A" might have first and second Boolean expressions "A1" and "A2" associated with transfer from state "A" to state "B" and a third Boolean expression "A3" associated with transfer from state "A" to state "C". The Boolean expressions associated with each state are prioritized. The Boolean expressions associated with a current state (i.e. a current location of the state machine) are evaluated. Upon evaluation, the current location of the state machine is transferred to a state associated with the Boolean expression(s) with the highest priority found to be true.

Each of the states 602-614 is associated with a general function. In the IDLE state 602, the decompressor core 504 waits for a new command. The DECODE_COMMAND state 604 looks at the current command. WRITE_SRC_INI (write seedrow copy initial) state 606 writes out the number of initial seedrow copy pixels (1, 2 or 3 in one possible embodiment) specified in the two seedrow count bits of the command. The WRITE_SRC_SUB (write seedrow copy subsequent) state 608 writes out subsequent seedrow copy pixels that are specified in seedrow copy count bytes that follow a command. A count byte of 0xFF corresponds to 255 pixels. The last count byte must be a terminating 0x00 or a non 0xFF count. The WAIT_FOR_FP (wait for first pixel) state 610 waits for the first pixel of a run or literal to be available. The WRITE_REP_INI (write replication initial) state 612 writes out literal or run pixels specified in the replacement count bits of the command. The WRITE_REP_SUB (write replication subsequent) 614 state writes out literal or run pixels specified in the subsequent replacement count bytes. Like the seedrow copy count byte, a replacement count byte of 0xFF corresponds to 255 pixels. The last count byte must be a terminating 0x00 or a non 0xFF count.

The IDLE state 602 includes a sequence of prioritized equations including two Boolean equations. Where the first equation 602A, input_available=1, which is true, the current state of the state machine 600 changes the DECODE_COMMAND state 604. Where first equation is not true, the second equation 602B, "else" or "true" is always true, and the current state remains at the IDLE state 602.

The DECODE_COMMAND state 604 includes an sequence of prioritized equations of three Boolean equations. Where the first equation 604A, src_ini!=0 is true, the current state of the state machine 600 changes to the WRITE_SRC_INI state 606. Where the first equation is not true, and the second equation 604B, first_pixel_loaded=1 is true, the current state of the state machine 600 changes to the WRITE_REP_INI state 612. Where higher ranked equations are not true, the third equation 604C, "else" or "true" is always true, and the current state changes to WAIT_FOR_FP state 610.

The WRITE_SRC_INI (write seedrow copy initial) state 606 includes a sequence of prioritized equations including ten Boolean equations. Where the first equation 606A, decomp_eoi_b=1 is true, the current state of the state machine 600 changes to the IDLE state 602. Where the first equation is not true, and the second equation 606B, code_src_done=1 & decomp_eol_b=1 and cmd_ld_src=1 is true, the current state of the state machine 600 remains at WRITE_SRC_INI state 606. Where higher ranked equations are not true, and the third equation 606C, code_src_done=1 & decomp_eol_b=1 & loading_command=1 & cmd_ld_src=0 & (first_pixel_loaded=1 or loading_first_pixel=1) is true, the current state of the state machine 600 changes to the WRITE_REP_INI state 612. Where higher ranked equations are not true, and the fourth equation 606D, code_src_done=1 & decomp_eol_b=1 & loading_command=1 & cmd_ld_src=0 & decomp_eoi_b=0 is true, the current state of the state machine 600 changes to the WAIT_FOR_FP state 610. Where higher ranked equations are not true, and the fifth equation 606E, code_src_done=1 and decomp_eol_b=1 is true, the current state of the state machine 600 changes to the IDLE state 602. Where higher ranked equations are not true, and the sixth equation 606F, src_ini!="11" & code_src_done=1 & (first_pixel_loaded=1 or loading_first_pixel=1) is true, the current state of the state machine 600 changes to the WRITE_REP_INI state 612. Where higher ranked equations are not true, and the seventh equation 606G, src_ini!="11" & code_src_done=1 or (block__00_src=1 or block__00_src_d=1) & (first_pixel_loaded=0 or loading_first_pixel=0) is true, the current state of the state machine 600 changes to the WAIT_FOR_FP state 610. Where higher ranked equations are not true, and the eighth equation 606H, src_ini="11" & code_src_done=1 & (block__00_src=1 or block__00_src_d=1) & (first_pixel_loaded=1 or loading_first_pixel=1) is true, the current state of the state machine 600 changes to the WRITE_REP_INI state 612. Where higher ranked equations are not true, and the ninth equation 606I, src_ini=3 & code_src_done=1 & (src_sub_loaded=1 or ld_src_subsequent=1) is true, the current state of the state machine 600 changes to the WRITE_SRC_SUB state 608. Where higher ranked equations are not true, the tenth equation 606J, "else" or "true" is always true, and the current state remains at WRITE_SRC_INI state 606.

The WRITE_SRC_SUB state 608 includes a sequence of prioritized equations including nine Boolean equations. Where the first equation 608A, decomp_eoi_b=1 is true, the current state of the state machine 600 changes to the IDLE state 602. Where the first equation is not true, and the second equation 608B, code_src_done=1 & decomp_eol_b=1 & ((command_loaded=1 & next_src_ini!=0) or (loading_command=1 & cmd_ld_src=1)) is true, the current state of the state machine 600 changes to the WRITE_SRC_INI state 606. Where higher ranked equations are not true, and the third equation 608C, code_src_done=1 & decomp_eol_b=1 & loading_command=1 & cmd_ld_src=0 & (first_pixel_loaded=1 or loading_first_pixel=1) is true, the current state of the state machine 600 changes to the WRITE_REP_INI state 612. Where higher ranked equations are not true, and the fourth equation 608D, code_src_done=1 & decomp_eol_b=1 & loading_command=1 & cmd_ld_src=0 is true, the current state of the state machine 600 changes to the WAIT_FOR_FP state 610. Where higher ranked equations are not true, and the fifth equation 608E, code_src_done=1 & decomp_eol_b=1 is true, the current state of the state machine 600 changes to the IDLE state 602. Where higher ranked equations are not true, and the sixth equation 608F, src_orig!=255 & code_src_done=1 & (first_pixel_loaded=1 or loading_first_pixel=1) is true, the current state of the state machine 600 changes to the WRITE_REP_INI state 612. Where higher ranked equations are not true, and the seventh equation 608G, src_orig!=255 & code_src_done=1 or ((block_00_src=1 or block_00_src_d=1) & (first_pixel_loaded=0 & loading_first_pixel=0)) is true, the current state of the state machine 600 changes to the WAIT_FOR_FP state 610. Where higher ranked equations are not true, and the eighth equation 608H, src_orig=255 & code_src_done=1 & ((block_00_src=1 or block_00_src_d=1) & (first_pixel_loaded=1 & loading_first_pixel=1)) is true, the current state of the state machine 600 changes to the WRITE_REP_INI state 612. Where higher ranked equations are not true, the ninth equation 608I, "else" or "true" is always true, and the current state remains at the WRITE_SRC_SUB state 608.

The WAIT_FOR_FP state 610 includes a sequence of prioritized equations including two Boolean equations. Where the first equation 610A, first_pixel_loaded=1 or loading_first_pixel=1 is true, the current state of the state machine 600 changes to the WRITE_REP_INI state 612. Where higher ranked equation first equation is not true, the second equation 610B, "else" or "true" is always true, and the current state remains at WAIT_FOR_FP state 610.

The WRITE_REP_INI state 612 includes a sequence of prioritized equations including fourteen Boolean equations. Where the first equation 612A decomp_eoi_b=1 is true, the current state of the state machine 600 changes to the IDLE state 602. Where the first equation is not true, and the second equation 612B, rep_orig=1 & code_rep_done=1 & ((ld_imm_cmd=1 and current_byte(4:3)!="00") or (ld_next_imm_cmd=1 & byte1_ahead(4:3)!="00")) is true, the current state of the state machine 600 changes to the WRITE_SRC_INI state 606. Where higher ranked equations are not true, and the third equation 612C, rep_orig=1 & code_rep_done=1 & (ld_imm_cmd=1 or ld_next_imm_cmd=1) & loading_first_pixel=1 & decomp_eoi_b=0 is true, the current state of the state machine 600 remains at WRITE_REP_INI state 612. Where higher ranked equations are not true, and the fourth equation 612D, rep_orig=1 & code_rep_done=1 & (ld_imm_cmd=1 or ld_next_imm_cmd=1) & loading_first_pixel=0 & decomp_eoi_b=0 is true, the current state of the state machine 600 changes to the WAIT_FOR_FP state 610. Where higher ranked equations are not true, and the fifth equation 612E, ((rep_orig!=8 & run=0) or (rep_orig!=9 & run=1)) & code_rep_done=1 & cmd_ld_src=1 & loading_command=1 & decomp_eoi_b=0 is true, the current state of the state machine 600 changes to the WRITE_SRC_INI state 606. Where higher ranked equations are not true, and the sixth equation 612F, ((rep_orig!=8 & run=0) or (rep_orig!=9 & run=1)) & code_rep_done=1 & cmd_ld_src=0 & loading_command=1 & (first_pixel_loaded=1 or loading_first_pixel=1) & decomp_eoi_b=0 is true, the current state of the state machine 600 remains at WRITE_REP_INI state 612. Where higher ranked equations are not true, and the seventh equation 612G, ((rep_orig!=8 & run=0) or (rep_orig!=9 & run=1)) & code_rep_done=1 & loading_command=1 & cmd_ld_src=0 & decomp_eoi_b=0 is true, the current state of the state machine 600 changes to the WAIT_FOR_FP state 610. Where higher ranked equations are not true, and the eighth equation 612H, ((rep_orig!=8 & run=0) or (rep_orig!=9 & run=1)) & code_rep_done=1 is true, the current state of the state machine 600 changes to the IDLE state 602. Where higher ranked equations are not true, and the ninth equation 612I, ((rep_orig=8 & run=0) or (rep_orig=9 & run=1)) & code_rep_done=1 & block_00_rep=0 & (rep_sub_loaded=1 or ld_rep_subsqnt=1) is true, the current state of the state machine 600 changes to the WRITE_REP_SUB state 614. Where higher ranked equations are not true, and the tenth equation 612J, ((rep_orig=8 & run=0) or (rep_orig=9 & run=1)) & code_rep_done=1 & block_00_rep=1 & loading_command=1 & cmd_ld_src=1 is true, the current state of the state machine 600 changes to the WRITE_SRC_INI state 606. Where higher ranked equations are not true, and the eleventh equation 612K, ((rep_orig=8 & run=0) or (rep_orig=9 & run=1)) & code_rep_done=1 & block_00_rep=1 & loading_command=1 & cmd_ld_src=0 & (first_pixel_loaded=1 or loading_first_pixel=1) is true, the current state of the state machine 600 remains at WRITE_REP_INI state 612. Where higher ranked equations are not true, and the twelfth equation 612L, ((rep_orig=8 & run =0) or (rep_orig=9 & run=1)) & code_rep_done=1 & block_00_rep=1 & loading_command=1 & cmd_ld_src=0 & (first_pixel_loaded=0 & loading_first_pixel=0) is true, the current state of the state machine 600 changes to the WAIT_FOR_FP state 610. Where higher ranked equations are not true, and the thirteenth equation 612M, ((rep_orig=8 & run=0) or (rep_orig=9 & run=1)) & code_rep_done=1 & block_00_rep=1 is true, the current state of the state machine 600 changes to the IDLE state 602. Where higher ranked equations are not true, the fourteenth equation 612N, "else" or "true" is always true, and the current state remains at WRITE_REP_INI state 612.

The WRITE_REP_SUB state 614 includes a sequence of prioritized equations including ten Boolean equations. Where the first equation, decomp_eoi_b=1 is true, the current state of the state machine 600 changes to the IDLE state 602. Where the first equation 614A is not true, and the second equation 614B, rep_orig!=255 & code_rep_done=1 & cmd_ld_src=1 is true, the current state of the state machine 600 changes to the WRITE_SRC_INI state 606. Where higher ranked equations are not true, and the third equation 614C, rep_orig!=255 & code_rep_done=1 & cmd_ld_src=0 & loading_command=1 & (first_pixel_loaded=1 or loading_first_pixel=1) is true, the current state of the state machine 600 changes to the WRITE_REP_INI state 612. Where higher ranked equations are not true, and the fourth equation 614D, rep_orig!=255 & code_rep_done=1 & cmd_ld_src=0 & loading_command=1 is true, the current state of the state machine 600 changes to the WAIT_FOR_FP state 610. Where higher ranked equations are not true, and the fifth equation 614E, rep_orig!=255 & code_rep_done=1 is true, the current state of the state machine 600 changes to the IDLE state 602. Where higher ranked equations are not true, and the sixth equation 614F, rep_orig=255 & code_rep_done & cmd_ld_src=1 & loading_command=1 is true, the current state of the state machine 600 changes to the WRITE_SRC_INI state 606. Where higher ranked equations are not true, and the seventh equation 614C, rep_orig=255 & code_rep_done=1 & cmd_ld_src=0 & loading_command=1 & (first_pixel_loaded=1 or loading_first_pixel=1) is true, the current state of the state machine 600 changes to the WRITE_REP_INI state 612. Where higher ranked equations are not true, and the eighth equation 614H, rep_orig=255 & code_rep_done=1 & cmd_ld_src=0 & loading_command=1 & (first_pixel_loaded=0 & loading_first_pixel=0) is true, the current state of the state machine 600 changes to the WAIT_FOR_FP state 610. Where higher ranked equations are not true, and the ninth equation 614I, rep_orig=255 & code_rep_done=1 & block_00_rep=1 is true, the current state of the state machine 600 changes to the IDLE state 602. Where higher ranked equations are not true, the tenth equation 614J, "else" or "true" is always true, and the current state remains_REP_SUB state 614.

Figure 7:
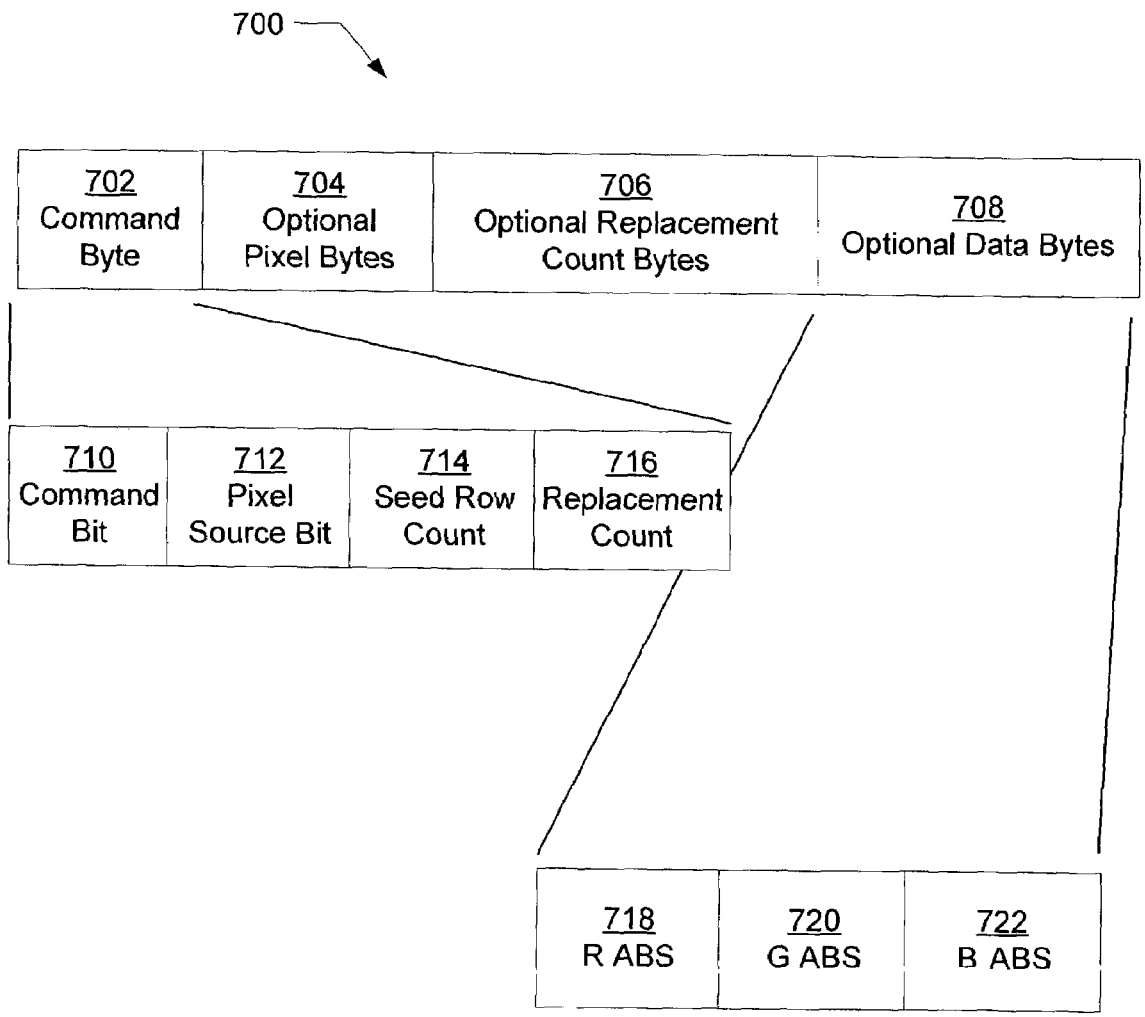
FIG. 7 is a schematic representation of an exemplary implementation of a data structure associated with compressed data.

FIG. 7 depicts an encoding format for compressed raster pixel data, RPD. Data 700 consists of a command byte 702 and optional seed row offset value fields, replacement count value fields 706, and color data. Replacement pixel data replaces the raw RPD with a replacement data string, also referred to herein as the "relative value string," which consists of a command, color data; optional seed row offset value and replacement count value fields are provided as needed. A series of replacement strings describe a raster. The command byte 702 has four segments: (1) CMD (command) bit 710; (2) pixel source bit 712; (3) seed row count 714; and (4) replacement count 716 where CMD Bit 710 is set to zero for a replacement pixel list (RPL) data group and set to one for a replacement pixel run (RPR) data group.

The pixel source bit 712 indicates the color of the compression run. In an exemplary implementation, 0 implies a new color (no caching is being used); 1 implies using west (i.e., preceding column, same row) color; 2 implies using northeast (i.e., superjacent row, following column) color; and 3 implies using a cached color. In this case, RPR groups pixel source bits indicate the color for an entire compression run where only one color is specified. In an RPL data compression run the pixel source bit 712 indicates the color for just the initial pixel in the run and remaining pixels are encoded in the data bytes field 708, which includes red, green and blue ABS (absolute) bytes 718, 720, 722 (i.e. bytes that are representing pixels which are passed directly, without encoding or overhead).

The seed row count 714 is the number of pixels to copy from the seed row; and replacement count 716 is the number of consecutive pixels to be replaced (in one embodiment, for RPL data transfers this is one less than the actual number (e.g., a replacement of six pixels is specified with a count of five); and for RPR transfers this is two less than the actual number).

If the seed row count 714 of the command byte is greater than two, additional offset values are set in the optional pixel bytes 704 field of the replacement data string which are added to the total seed row count 714. This happens until the last seed row count byte is indicated by a value less than two-five-five (255). If the replacement count 716 in the command byte 710 is greater than six, additional values are set in the optional replacement count bytes field 706 of the replacement data string that are added to the total replacement count. This happens until the last replacement count value is indicated by a value less than two-five-five (255).

If the CMD bit 710 is "0," the replacement data is a RPL encoded string. The number of pixels immediately following a command and its optional bytes is the replacement count plus 1. One exception occurs when pixel source does not indicate a new color for the first pixel. In this case, the number of pixels following the command and its optional bytes is the replacement count.

If the CMD bit is "1," the replacement data is a RPR encoded string; optional seed row count bytes and replacement count bytes may be added. If the pixel source bit indicates a new color, then it will be encoded in the data bytes field. Otherwise the color of the RPR will be obtained from an alternate source, as explained hereinafter, and there will be no data bytes. Just as in the RPL data case, an encoded pixel will be of the absolute form. The length of the run, in pixels, is the value of the replacement count 716 plus 2.

Figure 8:
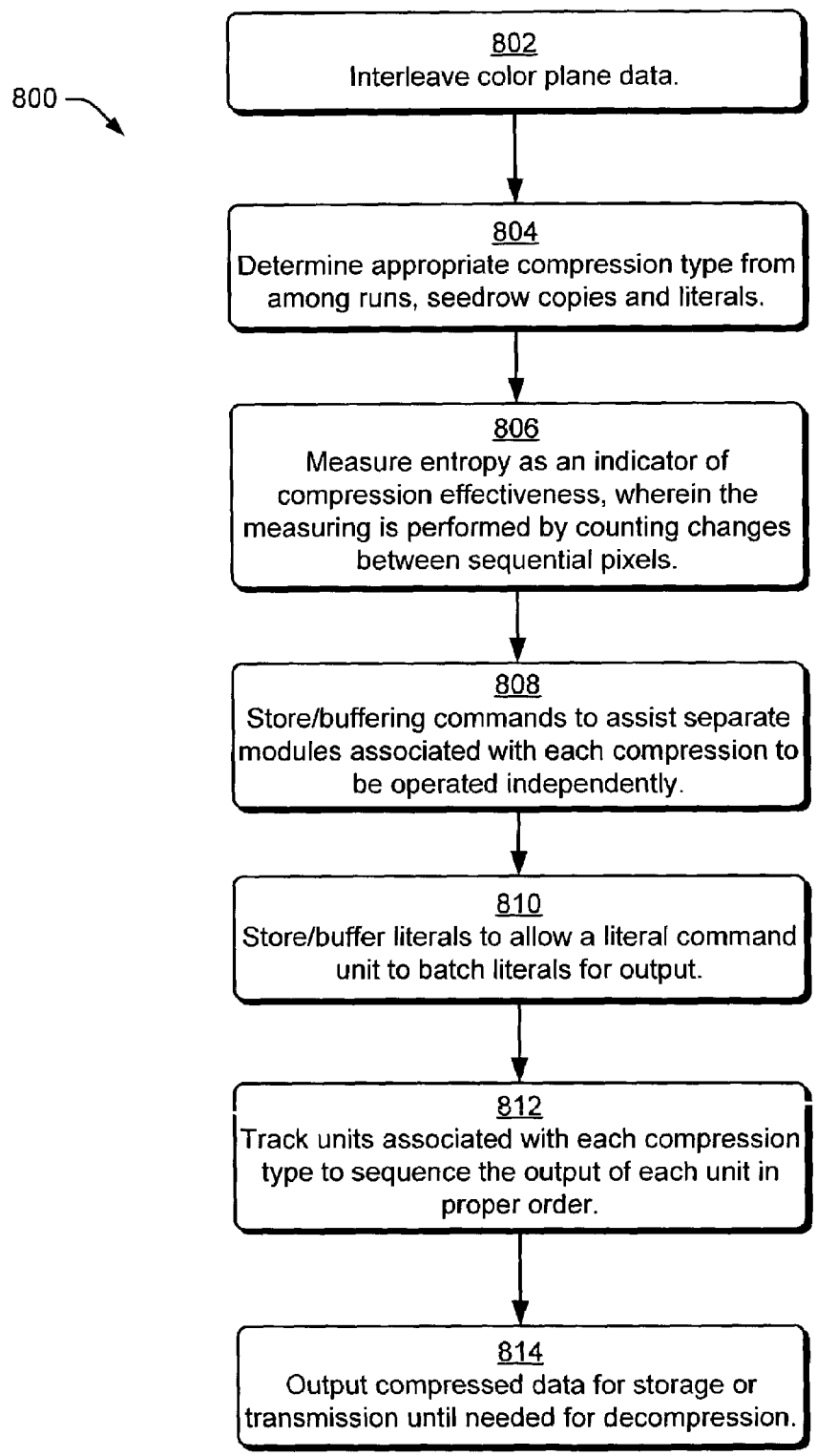
FIG. 8 is a flow diagram that illustrates one example of a method of compressing data.

The flow chart of FIG. 8 illustrates a further exemplary implementation, wherein a method 800 is employed to compress data. The elements of the method may be performed by any desired means, such as by use of an ASIC or by the execution of processor-readable instructions defined on a processor-readable media, such as a disk, a ROM or other memory device. Also, actions described in any block may be performed in parallel with actions described in other blocks, may occur in an alternate order, or may be distributed in a manner which associates actions with more than one other block.

At block 802, a data interleaver 404 interleaves the color plane data. The data may be arriving from any source, such as an interpreter, translating page description language into device ready bits.

At block 804, an input data interpreter 406 determines the appropriate compression to be used, such as runs, seedrow copies and literals. Accordingly, the data is sent in the alternative to a run command unit 426, a seed row copy unit 428 or a literal command unit 430.

At block 806, entropy is measured to provide an indicator of compression effectiveness. The measurement is performed by counting changes between sequential pixels, and may be performed by an entropy module 408-412 such as seen in FIG. 4. The changes in the sequential pixels represent changes in the numeric value of one or more color planes associated between two adjacent pixels. Thus, where the data associated with two adjacent pixels has changed in one or more color planes, this change would be counted and processed by the associated entropy module 408-412.

At block 808, a reorder buffer 424 is used to store up to eight commands and allows the seedrow copy, run, and literal units 426, 428, 430 to operate concurrently.

At block 810, the literal command unit 430 uses a memory device 432 to buffer as much as 255 bytes of literals (or similar quantity of data) at a time.

At block 812, the reorder buffer 424 keeps track of which unit, including the run command unit 426, a seed row copy unit 428 or a literal command unit 430, should be allowed to write data to the compression output module 434, thereby sequencing the output of each unit in the proper order.

At block 814, a compression output module 434 outputs compressed data which is stored, or transmitted, until needed for decompression.

Figure 9:
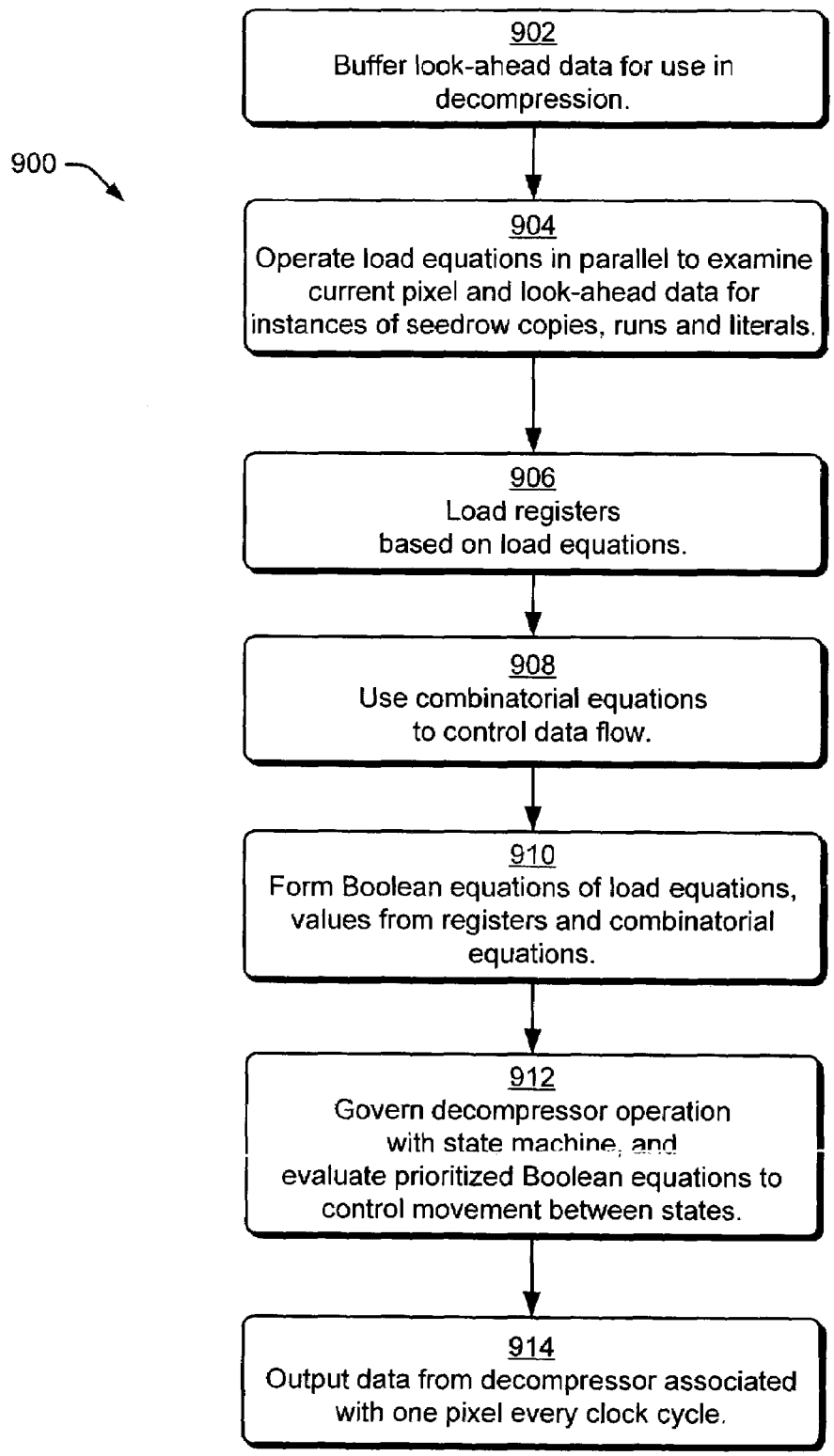
FIG. 9 is a flow diagram that illustrates one example of method of decompressing data.

The flow chart of FIG. 9 illustrates a further exemplary implementation, wherein a method 900 is employed to decompress data. The elements of the method may be performed by any desired means, such as by use of an ASIC or by the execution of processor-readable instructions defined on a processor-readable media, such as a disk, a ROM or other memory device. Also, actions described in any block may be performed in parallel with actions described in other blocks, may occur in an alternate order, or may be distributed in a manner which associates actions with more than one other block.

At block 902, look-ahead data is provided to a plurality of load equations. For example, while two 4-bytes buffers can be used to provide look-ahead data to the load equations, other buffer configurations and sizes could be utilized.

At block 904, the load equations may be operated asynchronously and in parallel to examine data (including current pixel data and look-ahead data) looking for instances of seedrow copies, runs and literals.

At block 906, registers are loaded based on the load equations. The registers include status indicators, pointers and other data which facilitates the decoder operation.

At block 908, the combinatorial equations are used to control data flow into and out of line buffers, a DMA and a downstream device (such as a print engine). Some of the combinatorial equations may include Boolean equations wherein the load equations and values of the registers are elements within the equations.

At block 910, Boolean equations are formed of load equations, register values, signals (strobes) and/or combinatorial equations.

At block 912, operation of the decompressor 318 is governed by a state machine. Movement between states within the state machine is controlled by prioritization and evaluation of the Boolean equations. Prioritization of the Boolean equations indicates the correct state change when more than one state change is indicated by Boolean equation evaluation. E.g., where movement from state 4 to both states 2 and 7 is indicated by the truth of the Boolean equations involved, Boolean equation priority may indicate that the state should change to state 7.

At block 914, in the course of operation of the decompressor 318, data associated with one pixel is input and output each clock cycle.

One possible implementation of various terms, equations, registers, data, variables, signals, commands and other logic follows:

Load Equation Terms:

ld_next_cmd_lit: This term occurs if the current command is not a run (indicating a literal). It looks to see that a replication is in progress (rep_in_progress=1), that the current byte being transferred is the last byte (last byte=1), and that it is being transferred out (decomp_xfer=1). Finally it checks that the last byte is not the last byte of the strip (decomp_eoi=0).

ld_next_cmd_run: This term occurs if the current command is a run. It looks to see that a replication is in progress (rep_in_progress=1) or a seedrow copy is in progress (src_in_progress=1). If a seedrow copy takes us to the end of a line, it can be considered a command by itself. In this case the seedrow copy is encoded as a run, but since it goes to the end of the line, no actual run replacement occurs before the next command is loaded. We check that the current byte being transferred is the last byte (last byte=1), that it is being transferred out (decomp_xfer=1), and that the last byte is not the last byte of the strip (decomp_eoi=0).

id_imm_cmd: There is a case where the literal is only 1 byte in length. If we don't want to stall we have to be able to immediately load the next command buffer, even though for this case the command_loaded term is still true due to the current command. command_loaded does not clear until the first pixel has been decoded for the current command. This corner case is for a 1 literal command at the beginning of a transfer set. This term is also used when we have one single seedrow copy at the end of the line. Again, the Id_next_cmd_run term above won't fire because the command_loaded term is still true. For the case of one literal, the term checks to see that the original replication count is 1 (rep_orig=0x01), that a replication is in progress, and that the replication is an initial literal (run=0 and rep_mux_ctl=0) or a subsequent run. We check for the subsequent run in case we encounter a subsequent run count of 1. If this happens we have to output the last run value and immediately load the next command. For the case of a seedrow copy, the term checks for an original seedrow copy of 1 (src_orig=1), checks to see that a seedrow copy is in progress, that this is an initial seedrow copy (src_mux_ctl=0), and that end of line is true (decomp_eol_b=1). For any case but an initial seedrow copy of 1, other terms are in place to facilitate the loading of the next command. For any case but end of line true, the seedrow copy is not the last action of the current command. Finally, for either of these cases, a check is made to make sure that the current pixel is the last pixel of the strip, that we are transferring the single pixel out, and that the next command is available. In this case we check for input_available=1, which tells us if current_pointer is pointing to a valid byte. Current_pointer is pointing to the next command in this case because the current command definantly does not have any subsequent bytes.

Id_next_imm_cmd: This term addresses the case where the literal of length 1 occurs at the end of a long literal run (due to a subsequent length of one), making the next byte the next command. Because of this, we look for byte1_ahead_avail instead of current_pointer. We also check to make sure that the replication length is 1 and that we are doing a literal (run=0) and that we are in a subsequent replication mode (rep_mux_ctl=1). We make sure that the current byte isn't the last byte of the strip, and that we are currently transferring the last byte.

inc_next_ptr_1: When we load the next command either by ld_next_cmd_run or by ld_imm_cmd, we should increment the current pointer by 1 byte. We do this because when ld_next_cmd_run or ld_imm_cmd is true, the current_pointer is pointing at next command byte. Thus when we load the next command, we simply increment the pointer by one so that it now points at the next byte past the command.

ld_next_fb_lit: When we are performing a literal replacement and load the next command, and the next command requires a first pixel, we assert this strobe. Besides checking to make sure the current command is a literal and that the current byte is the last byte, we also check to make sure that the byte2_ahead in the compressed data stream is present in the input buffer (byte2_ahead_avail=1). Because we are in a literal replacement, the current_pointer points to the last byte of the replacement. Current_pointer plus 1 points to the next command, and current pointer plus 2 points to the first pixel (if one is required). To determine if a first pixel is required, we make sure that the next command does not have any seedrow copy counts (byte1_ahead(4)=0 and byte1_ahead(3)=0) and that the location documented for the first pixel in the command is 0x00 (byte1_ahead(6)=0 and byte1_ahead(5)=0). We also make sure that the first pixel has not be previously loaded (first_pixel_loaded=0) and that we are not approaching the end of line (eol_approach=1 or eol_approach_d=1).

ld_next_fb_run: When we are performing a run replication and load the next command, and the next command requires a first pixel, we assert this strobe. Besides check into make sure that the current command is a run and that the current byte is the last byte, we also check to make sure that the byte1_ahead in the compressed data stream is present in the input buffer (byte1_ahead_avail=1). Because we are in a run replication, the current_pointer points to the next command, and current pointer plus 1 points to the first pixel (if one is required). To determine if a first pixel is required, we make sure that the next command does not have any seedrow copy counts (current_byte(4)=0 and current_byte(3)=0) and that the location documented for the first pixel in the command is 0x00 (current_byte(6)=0 and current_byte(5)=0). We also make sure that the first pixel has not be previously loaded (first_pixel_loaded=0) and that we are not approaching the end of line (eol_approach=1 or eol_approach_d=1). Finally we make sure that the command hasn't been previously loaded (we use a load strobe in the seedrow copy section, described below, if this happens) and that the current pixel is not the last pixel of the strip.

ld_imm_fb: This load strobe goes with ld_imm_cmd above, which is in place for a literal of length 1 or a seedrow copy of length 1. Besides making sure that we are in either a literal or seedrow copy of length one (as described in detail for ld_imm_cmd above) we also make sure that byte1_ahead_avail is true. Because the current_pointer is pointing to the command, current_pointer plus 1 will be pointing to the first byte. We also make sure that we are transferring the last byte of previous command, that we are not at the end of the end of strip, and that this new command does need a first byte. Finally, we make sure that there aren't more than three seedrow copies to perform. Remember that if there are more than three seedrow copies to perform the next byte(s) will be subsequent seedrow counts and not the first pixel.

ld_next_imm_fb: This load strobe goes with ld_next_imm_cmd above, which is in place for a literal of length 1 at the end of a subsequent replacement. Besides making sure that we are in a literal replacement we also make sure that byte2_ahead_avail is true. Because the current_pointer is pointing to the last pixel, current_pointer plus 1 will be pointing at the next command and current_pointer plus 2 will be pointing at the first pixel. We also make sure that we are transferring the last byte of previous command, that we are not at the end of the end of strip, and that this new command does need a first byte. Finally, we make sure that there aren't more than three seedrow copies to perform. Remember that if there are more than three seedrow copies to perform the next byte(s) will be subsequent seedrow counts and not the first pixel.

inc_next_ptr_2: For the command load strobes ld_next_cmd_lit and ld_next_imm_cmd, we increment the pointers by two positions because in these cases the command that is loaded is one position ahead of the current_pointer. We also increment the pointer by two positions if we get first byte strobes ld_next_fb_run or ld_imm_fb because in these cases the current_pointer is pointing at the new command, putting the first pixel one byte position ahead.

inc_next_ptr_3: If we get the first byte load strobes ld_next_fb_lit or ld_next_imm_fb, we increment the pointers by three positions. In these cases, the current_pointer is pointing to the last pixel of the previous command, the current_pointer plus 1 is pointing to the new command, and the current_pointer plus 2 is pointing to the first pixel. If we load the command and the first pixel, we need to advance the pointers by 3 positions to get to the next unread byte.

For all of these strobes, it should be clear that the command and first pixel strobes should occur in synchronicity with each other. Circuitry can be implemented to make sure that 4 pixels ahead of current_pointer are in the input buffer to prevent a stall. See decomp_ack in a future section regarding this detail.

Also note that inc_next_ptr_3 and inc_next_ptr_2 could both occur at the same time. It is the policy of this block that when two increment strobes occur, the larger one will be the one that is performed.

src_sub_case: This term defines when we are doing a seedrow copy that will require additional seedrow copy counts. This will occur when we are doing an initial seedrow copy (using the count in the command byte) and the count is 0x03, or when we are doing a subsequent count (using an in-stream count) and the count is 0xFF.

ld_src_subsqnt: This term is used to load the next subsequent seedrow copy count from the input compressed data stream. Here we make sure that we are transferring the last byte (src_count=1 and decomp_ack=1) as defined by the previous seedrow copy count, and that we indeed need to get another count (as defined by src_sub_case=1). We also check to make sure that we are not at the end of the strip, and that we haven't yet loaded the next subsequent count. Because we have previously loaded the command and are performing a seedrow copy (which doesn't require more compressed stream bytes), the current_pointer is pointing to the next byte in the compressed data stream. We also make sure that it is not 0x00 (current_byte/=0x00). If it were 0x00, we would skip it and load the first pixel, if required. If the next byte is 0x00, this load equation is disabled and another term is used to skip and load.

block_00_src: This term looks for the above-mentioned case where the next seedrow copy count is actually a terminating count of 0x00. To determine that we look for the exact same conditions as for ld_src_subsqnt, but we check for current_byte=0x00. This term being true means that we should skip the next byte and move on. It is used in the following equations.

ld_next_cmd_00_src: This term is used to load a new command if the seedrow copy happens to end a line and the last valid seedrow copy count was 0xFF. In this case we skip the next byte in the compressed input data stream and load the next byte as the next command. This term looks for block_00_src being true. If it is true, we know we skip the next byte. We check to see if it should be loaded as a command by looking at eol_approach_d, which is a registered version of eol_approach. eol_approach is set true when we load a seedrow copy count (initial or subsequent) that will take us to the end of the line. When this is true, we know that the seedrow copy ends a line and that instead of continuing on with a literal or run replacement we should load a new command. We don't qualify with decomp_xfer here, because that is covered by block_00_src.

ld_next_fb_00_src: This term goes along with the last term. If we are loading a new command and the seedrow copy count is less than 3 (byte1_ahead 4:3/=0x03) and location of the first pixel of this next command is in-line (byte1_ahead 6:5='00'), then we assert this term as well. Note that this term is qualified with block_00_src, just as the last equation was. However, in this term we look for byte2_ahead_avail=1 since the current_pointer plus 2 is pointing at this first pixel (current_pointer is pointing at 0x00 and current_pointer plus 1 is pointing at the new command). Finally we make sure that we haven't loaded the first_pixel (first_pixel_loaded=0). We don't qualify with decomp_xfer here, because that is covered by block__00_src.

ld_fb__00_src: This term loads the first pixel, if needed, for the following run or literal when the end of the seedrow copy is detected and the last src_count was 0xFF and the next byte is the terminating 0x00. We again detect this using block__00_src. We make sure that the current seedrow copy doesn't take us to the end of line by looking at eol_approach and eol_approach_d (both should be 0). We check to make sure that the byte at current_pointer plus 1 is available (byte1_ahead_avail=1), that we haven't yet loaded the first pixel, and the indeed we need to load a first pixel (location=1). We don't qualify with decomp_xfer here, because that is covered by block__00_src.

skip__00_src: This term fires when we have a seedrow copy that was ended with an initial count of 0x03 or subsequent count of 0xFF, and the location of the first pixel is not 0x00. Because we don't need a first pixel, we assert this term to simply increment the current_pointer past the seedrow copy terminating count 0x00. We check for the first condition using block__00_ld and check for the second condition using location. We make sure that we are not at the end of line using eol_approach and eol_approach_d.

ld_next_fb_src: This term loads the first pixel, if needed, for the following run or literal when the end of the seedrow is detected and the seedrow copy itself does not require additional counts. For this strobe we make sure that we are not at the end of the line using eol_approach and eol_approach_d. We check to see that the byte pointed to by current_pointer is valid (input_available=1), that the command requires a first pixel (location=00), and that we haven't loaded the first pixel. We check first_pixel_loaded because we want to make sure that if we loaded the first pixel as part of the command load, we don't try and load it again. This necessarily says that the initial seedrow copy count was greater than three. Because we want to load at the last seedrow copy count, we make sure that we are at the last pixel count. To do this we check if either src_count=0x01 (src_orig>1) or that src_orig=1, and that we are not expecting more counts (src_sub_case=0). Finally, we verify that we are indeed in a seedrow copy (src_in_progress=1) and that we are actually transferring a pixel (decomp_ack=1).

inc_endsrc_ptr__1: We increment the pointers by 1 position if we are loading just a first pixel (ld_next_fb_src), if we are just loading an additional seedrow copy count (ld_src_subsqnt), or if we are need to skip the in-stream 0x00 (skip__00_src). Also, we increment by 1 anytime block__00_src is true to cover the case where the last byte of an input compressed word is 0x00 (a terminating count) and the next compressed word is not yet available. In this case we need to skip the terminating 0x00, even though we aren't loading a new command or count, so that we are ready for the next valid byte when the next word is finally valid.

inc_endsrc_ptr__2: We increment the pointers by 2 positions if we are skipping a 0x00 to load the next command (ld_next_cmd__00_src), or if we having to skip a 0x00 to load the first pixel for the current command (ld_fb__00_src).

inc_endsrc_ptr__3: We increment the pointers by 3 positions if we are skipping a 0x00 to load the first pixel for the next command (ld_next_fb__00_src).

For all of these strobes, it should be clear that the command and first pixel strobes should occur in synchronicity with each other, if a first pixel is required. Circuitry can be used to make sure that at least 4 pixels ahead of current_pointer are contained in the input buffer to prevent a stall. See decomp_ack in a future section regarding this detail.

Also note that inc_endsrc_ptr__3 and inc_endsrc_ptr__2 could both occur at the same time. It is the policies of this block that when two or more increment strobes occur, the larger one will be the one that is performed.

ld_cmd: This term is true when we have stalled out waiting for the next command and new data is available. When we are either starting out or have been putting out bytes and stall waiting for the next command, the control state machine goes to idle (dec_idle). When more compressed input data is available, input_available will be true. If we haven't loaded a command (command_loaded=0) and we are in idle (current_dec_ctl=dec_idle) this term will assert.

ld_first_byte: This term is true when we are loading a command and the command calls out for a first pixel and the number of seedrow copies is less than three. Current_pointer points to the new command. If current_byte (6:5)=00, then we fetch a first pixel from the compressed data stream. If current_byte (4:3) is less than 3, there will be less than 3 seedrow copies. We check to make sure that the byte after the current byte is available (byte1_ahead_avail=1). If first_pixel_loaded is not true, we are in idle (like the above term) and the seedrow copy of the command won't end the line, we assert this strobe. It can be that the command itself would finish the line if the seedrow copy takes us to the end of the line, and if this happens we certainly do not want to load the first pixel. We tell if the command will take us to the end of the line by looking at both eol_approach and eol_approach_d, which are set if a new seedrow copy count will run to the end of the row.

inc_idle_ptr__1: If we load the command (ld_cmd), we increment the pointer by 1.

inc_idle_ptr__2: If we load the first_pixel (ld_first_byte), we increment the pointer by 2.

For these strobes, it should be clear that the command and first pixel strobes should occur in synchronicity with each other, if a first pixel is required. There is circuitry in place to make sure that at least 4 pixels ahead of current_pointer should be in the input buffer or a stall will occur. See decomp_ack in a future section regarding this detail.

Also note that inc_idle_ptr__1 and inc_idle_ptr__2 could both occur at the same time. It is the policies of this block that when two or more increment strobes occur, the larger one will be the one that is performed.

rep_sub_case: This term tells us that we are in a run replication or literal replacement where we are expecting more counts. We possibly need more counts if we are using the initial count in the command and it is 7, or if we are using a subsequent count and it is 0xFF. The signal initial is used to tell us that we are replicating counts from the command count (initial=1). Thus if initial equals 0 and the rep_orig equals 0xFF, we know that we are replicating a subsequent count of 0xFF. The initial replication has two different cases. The first occurs if we are in a run, because here rep_orig will equal 9 if the actual value in the command field was 7. Remember from section 1.0 that for a run, the replication count is actually two less than the desired run value, and for literals it is one less. Thus for literals we check to see if rep_orig is equal to 8. We use the rep_orig value instead of the original value out of the command because the command register becomes invalid after it is read to load rep_orig, location, run, and src_orig. Finally, we check to see that rep_sub_loaded is false, so that we don't load a subsequent value more than once.

block_rep_ld: This strobe is used signal the fact that the current replication count is either 8/9 and we are in an initial replication or the current replication count is 0xFF and we are in a subsequent count, and the next byte is a 0x00. Future terms will take this into account, using it when they are ready to load either another count or a new command. If rep_sub_case is true, we know that we should be looking for more counts. If the current byte is available (input_available=1) and the current byte is 0x00, and either we are in a run and decomp_xfer is true, or we are waiting for a valid count (wait_rep=1), we will assert this strobe. Note that in either the case where we have a run, or where we are waiting for a valid next byte, the current_pointer is pointing at this next count value, thus the reason we look for input_available. Alternatively, if we are in a literal replication, we check for byte1_ahead_avail=1 and byte1_ahead=0x00 to determine if we should assert this strobe. For this case, as with the run case, we make sure we are transferring data (decomp_ack=1) and that we are not in a run (run=0).

ld_rep_subsqnt: This strobe is used to load another replication count when the current count runs out (rep_count=0x01) and we indeed need another count (rep_sub_case=1). We check to make sure that the next value should be loaded (block_rep_ld=0) and that either we are transferring data out of the decompressor (decomp_ack=1). We check to make sure that data is available (input_available=1) for either a run or if we are waiting, since in either case the current_pointer is pointing to the next byte. If we are doing a literal, we check to make sure that byte1_ahead_avail=1 since the current_pointer is pointing to the last pixel and the current_pointer plus 1 is pointing to the next count.

inc_repsub_ptr_1: This strobe is used the increment the pointers by one position when we load a subsequent replication value and we are doing a run, or when block_00_rep is true. When we are doing a run replication, the current pointer is pointing at the next compressed byte, which in this case is the next run count. Thus when we load the next run replication value, we simply increment the pointer by 1 to get to the next byte. If block_00_rep is true and we are doing a run, we should increment the pointer by 1 at the end of the current transfer, which is the last transfer of the previous command. Normally we would also be loading at least a new command, and possibly a new first pixel, so that we actually increment by more than one. However, the case exists where the next command is in the next compressed word, which is not yet loaded into the decompressor. This should cause us to transition to the idle state and wait for the new data. If we don't increment the pointer by 1, we would be pointing at the terminating 0x00 when new data was available, causing the 0x00 to be loaded as the next command. Thus we move the pointer ahead by one so that current_pointer is pointing at the next valid byte. Note that we only increment by one since for a run the current_pointer was already pointing at the terminating 0x00.

block_00_rep: This strobe is used to flag when block_rep_ld is true and we are transferring the last byte of the current command out of the decompressor. Block_rep_ld does not identify when this case is happening, it only identifies when the case could happen. If rep_sub_case is true, rep_count=0x01, and block_rep_ld is true, we assert this signal to say that we are transferring the last byte out and the next byte is a terminating 00 which should be ignored.

ld_next_cmd_00_rep: If block_00_rep is true, we need to skip the 00 and immediately load the next byte, which is a command byte. If it is a run, the current_pointer is pointing at the next byte, which in this case is 00. Thus we want to load the byte after the 00, which is at current_pointer plus 1. If we are in a literal, we look for byte2_ahead_avail to be true, denoting that the byte at current_pointer plus 2 is valid. Because this is a literal, the current_pointer points to the last literal, the current_pointer plus 1 points at 00, and the current_pointer plus 2 points at the next command. For either run or literal we also check to make sure that we are transferring data (decomp_xfer=1).

ld_next_fp_00_rep: : If block_00_rep is true, we need to skip the 00 and immediately load the next byte, which is a command byte. We might have to load a first pixel as well. If block_00_rep is true and we are current doing a run we look to see if byte1_ahead (6:5) is 00 and if byte1_ahead (4:3) is not equal to 3. If both of these are true, we load a first byte. Because this is a run, the current_pointer is pointing at the next byte, which in this case is 00. Thus we want to load the byte after the 00, which is at current_pointer plus 1. The first pixel is actually at current_pointer plus 2, so we also check to see that byte2_ahead_avail is true. If we are in a literal, we look to see if byte2_ahead (6:5) is 0x00 and if byte2_ahead (4:3) is not equal to 3. If both of these are true, we load a first byte. Because this is a literal, the current_pointer points to the last literal, the current_pointer plus 1 points at 00, and the current_pointer plus 2 points at the next command, and current_pointer plus 3 points at the first pixel. Thus we check for byte3_ahead_avail to be true. We don't look for decomp_xfer here because it is covered in block_00_rep.

inc_repsub_ptr_2: This strobe increments the pointers by 2. We assert it if ld_rep_subsqnt is true and we are doing a literal, or if ld_next_cmd_00_rep is true and we are doing a run. When we are doing a literal, remember that the next replication count is not at the current_pointer, but at current_pointer plus 1 since current_pointer points at the last literal. Thus we increment by 2. If we are doing a run and the last count is a terminating 00, then the current_pointer points at the 00 and the current_pointer plus 1 points at the next command. Thus after loading the next command we need to increment the pointer by 2. If block_00_rep is true and we are doing a literal, we should increment the pointer by 2 at the end of the current transfer, which is the last transfer of the previous command. Normally we would also be loading at least a new command, and possibly a new first pixel, so that we actually increment by more than one. However, the case exists where the next command is in the next compressed word, which is not yet loaded into the decompressor. This should cause us to transition to the idle state and wait for the new data. If we don't increment the pointer by 2, we would be pointing at the terminating 0x00 when new data was available, causing the 0x00 to be loaded as the next command. Thus we move the pointer ahead by two so that current_pointer is pointing at the next valid byte. Note that we increment by two since for a literal the current_pointer was pointing at the last byte, which is one ahead of the terminating 0x00.

inc_repsub_ptr__3: This strobe increments the pointers by 3. We assert it if we are doing a run and ld_next_fp__00_rep is true, or if we are doing a literal and ld_next_cmd__00 rep is true. When we are doing a run and we encounter a terminating 00, current_pointer plus one points to the next command, making current_pointer plus two point to the first pixel. Thus we need to increment the pointer by 3. When we are doing a literal and we encounter a terminating 00, the current_pointer is pointing at the last pixel, the current_pointer plus 1 is pointing at the 0x00, and current_pointer plus 2 is pointing at the next command. Thus we need to increment the pointer by 3.

inc_repsub_ptr4: This strobe increments the pointers by 4. We assert it if we are doing a literal and ld_next_fp__00_rep occur. When we are doing a literal and we encounter a terminating 00, the current_pointer is pointing at the last pixel, the current_pointer plus 1 is pointing at the 0x00, current_pointer plus 2 is pointing at the next command, and current_pointer plus 3 is pointing at the first pixel. Thus we need to increment the pointer by 4.

For these strobes, it should be clear that the command and first pixel strobes should occur in synchronicity with each other, if a first pixel is required. There is circuitry in place to make sure that at least 4 pixels ahead of current_pointer should be in the input buffer or a stall will occur. See decomp_ack in a future section regarding this detail.

Also note that inc_repsub_ptr__2 and inc_repsub_ptr__3 could both occur at the same time, as could inc repsub_ptr__3 and inc_repsub_ptr__4. It is the policies of this block that when two or more increment strobes occur, the larger one will be the one that is performed.

last_byte: The signal last_byte is used in the above equations to flag when the last data byte of the operation is flowing out. Note that for literals of length of 1 we don't signal last byte. This is done so that we don't overload a load equation and have more than one load equation firing. In this case we have an explicit load term (ld_imm_cmd). Last byte is an 'OR' of the following terms.

src_of__1_eol: When src_orig_m1, the original value of the loaded seedrow copy count minus 1, is equal to 0 and a seedrow copy is in progress (src_in_progress=1), and we are at the end of the line (decomp_eol_b=1), we assert this strobe. Note that we look for the end of the line because, except for this case, a seedrow copy does not end a command. src_orig_m1 is used here instead of looking for the transfer of src_orig=1 because looking for 0x00 is probably easier than looking for 0x01 and decomp_xfer being true.

src_gt__1: This strobe is asserted when we are doing a seedrow copy (src_in_progress=1), the src_count is 1, we aren't expecting more counts, and we are at the end of the line. Note that we look for the end of the line because, except for this case, a seedrow copy does not end a command.

rep_g__1: This strobe is asserted when we are doing a replication (rep_in_progress=1), rep_count_m1 is 0, and we aren't expecting more counts.

Combinatorial Signals

The next terms are used to load registers and control data flow into and out of the decoder.

Register Control Signals cmd_ld_src: This signal tells us that the next command has seedrow copy content.

This signal will be asserted if we have loaded the command (command_loaded=1) and its associated seedrow copy count is not 0 (next_src_ini/=0).

If ld_cmd is true (occurs in current_dec_ctl of dec_idle), ld_next_cmd_run is true (indicating that a run is finishing and we are loading a new command), or if ld_imm_cmd is true (indicating that we are doing a seedrow copy or literal replication of 1), we will assert this command if current_byte (4:3) is not 0. We use current_byte here because in each of these cases current_byte points to the new command.

If Id_next_cmd__00_rep is true (indicating that we are skipping a terminating 00 at the end of a run or literal) and we are in literal replacement mode, we assert this signal if byte2_ahead (4:3) is not 00. We use byte2_ahead for this literal case because on the last byte the current_pointer is pointing to the last pixel, the current_pointer plus 1 is pointing to the 00, and the current_pointer plus 2 is pointing to the new command.

If ld_next_cmd__00_src or ld_next_imm_cmd are true, we assert this signal if byte1_ahead (4:3) is not equal to 0. We use byte1_ahead because for a seedrow copy with a terminating 0x00 the current_pointer is pointing to the 00 and the current_pointer plus 1 is pointing to the next command. for ld_next_imm_cmd, current_pointer is pointing the last command, making current_pointer plus 1 point to the new command. Thus we use byte1_ahead for the check.

If ld_next_cmd__00_rep is true and we are doing a run and byte1_ahead (4:3) is not equal to 0, we will assert this signal. We use byte1_ahead here because if we are in a run and there is a terminating 0x00, current_pointer will point to the 0x00, making current_pointer plus 1 point to the next command.

If ld_next_cmd_lit is true and we are either currently transferring a subsequent count (rep_mux_ctl=1) or transferring an initial count (rep_mux_ctl=0) of more than one byte (rep_orig_m1 /=0) and byte1_ahead (4:3) is not equal to 0, we assert this signal. We use byte1_ahead here because if we are performing a literal replication and we have more than one byte to transfer, current_pointer will be pointing to the last pixel of the replication, thus making current_pointer plus 1 point to the new command.

Finally, if ld_next_cmd_lit is true and we are transferring an initial count (rep_mux_ctl=0) and we are only transferring one byte (rep_orig_m1=0) and current_byte (4:3)/=00, we assert this signal. We use current_byte here because when there is only one byte of a literal to send out, and we are currently sending that first byte out, current_pointer will be pointing to the next command. This is because the first_pixel was previously loaded with the last command.

cmd_ld_no_fp: This signal allows the signal loading_first_pixel to fire, even though we are not loading a first pixel. We do this so that first_pixel_loaded will be set; this allows us more easily control the state machine.

If we are in current_dec_ctl=dec_idle and we are loading a command (ld_cmd) or if ld_next_cmd_run is true, or if ld_imm_cmd is true, and current_byte (6:5) is not 00, we assert this signal. We use current_byte with ld_cmd, because if we are in idle, current_byte is pointing to the next valid byte, which will be the next command. We have to check the command bits (6:5) to see if location is 00 or not. If it is not 00, we do not load a first pixel. ld_next_cmd_run tells us that we sending out the last byte of a run. In this case the current_pointer has been pointing to the next valid byte for a while, which is the next command. Id_imm_cmd tells us that there is a literal of length 1 occurring. In this case we have loaded the command and first_pixel (if needed) for the last command, making current_pointer point to the next valid byte, which the next command.

If ld_next_cmd__00_rep is true and we are doing a literal (run=0) and byte2_ahead (6:5) is not 00, we assert this signal. We use byte2_ahead because on a literal, the current_pointer is pointing to the last pixel, making current_pointer plus 1 point to 00 and current_pointer plus 2 point to the new command.

If id_next_cmd__00_src is true or ld_next_imm_cmd is true and byte1_ahead (6:5) is not 00, we assert this signal. If ld_next_cmd__00_src is true, we know that current_pointer is pointing to the 0x00 terminating byte, making current_pointer plus 1 point to the next command. If ld_next_imm_cmd is true, we know that current_pointer is pointing to the last literal, because ld_next_imm_cmd occurs only when there is one last literal at the end of a subsequent literal replication. In this case current_pointer plus 1 is pointing the next byte after the last pixel, which is the next command.

If ld_next_cmd__00_rep is true and we are doing a run and byte1_ahead (6:5) is true, we assert this signal. In the case of runs, the pointers increment after the run command or subsequent counts have been loaded. Thus for runs the current_pointer points to the next count, which in this case is the 0x00 terminating count. Thus current_pointer plus 1 points to the next command.

If ld_next_cmd_lit is true and we are transferring subsequent counts (rep_mux_ctl=1) and byte1_ahead (6:5) is not 00, we assert this signal. In this case we are currently doing a literal replication and we are replicating subsequent bytes, meaning that current_pointer is pointing to the literal pixels. When current_pointer is pointing to the last pixel, ld_next_cmd_lit is true. At this time current_pointer plus 1 will be pointing the byte after the last pixel, which is the next command.

If ld_next_cmd_lit is true and we are doing an initial replication (rep_mux_ctl=0) and we are transferring more than 1 literal and byte1_ahead (6:5) is not 00, we assert this signal. In this case we are doing a literal replacement of more than 1 pixel and less than 8 pixels. This means we won't have subsequent bytes to load or a terminating count of 0x00 to skip. In this case current_pointer is pointing to the last pixel (when ld_next_cmd_lit is true), making current_pointer plus 1 point to the next command.

loading_command: This is a simple 'OR' of every command load equation from above. They are ld_next_cmd_lit, ld_next_cmd_run, ld_next_cmd__00_rep, ld_cmd, ld_imm_cmd, ld_next_imm_cmd, and ld_next_cmd__00_src.

loading_first_pixel: This is a simple 'OR' of every first pixel load equation from above. They are ld_first_byte, ld_next_fb_run, ld_imm_fb, ld_next_imm_fb, ld_next_fb_lit, ld_next_fb_src, ld_next_fb__00_src, ld_next_fp__00_rep, cmd_ld_no_fp, ld_fp__0_src, and skip__00_src.

inc_ptr__1: This is a simple 'OR' of every increment by 1 equation from above. They are inc_next_ptr__1, inc_endsrc_ptr__1, inc_idle_ptr__1, inc_repsub_ptr__1. Also, for literal replications, we increment the pointer by 1 on each transfer. To do this we look for dec_rep_count being true (which tells us that we transferred), run being false (we are in literal mode) and the first pixel not being loaded (first_pixel_loaded=0). We check for first pixel not being loaded because we don't want to increment the pointer on the first pixel when we have already loaded the first pixel. We do not allow this signal to assert if inc_ptr__2, inc_ptr__3, or inc_ptr__4 are true.

inc_ptr__2: This is a simple 'OR' of every increment by 2 equations from above. They are inc_next_ptr__2, inc_endsrctr_ptr__2, inc_idle_ptr__2, and inc_repsub_ptr__2. We do not allow this signal to fire if inc_ptr__3 or inc_ptr__4 are true. Inc_ptr__4 is not currently in this equation like it should be!!!

inc_ptr__3: This is a simple 'OR' of every increment by 3 equations from above. They are inc_repsub_ptr__3, inc_next_ptr__3, and inc_endsrc_ptr__3. We don't allow this signal to fire if inc_ptr__4 is true.

inc_ptr__4: This is a simple 'OR' of every increment by 4 equations from above. The only one is inc_repsub_ptr__4. This signal is simply here for clarity.

initial: is decoded from bit 9 of the current_dec_ctl state machine src_in_progress: Decoded from bit 8 of the current_dec_ctl state machine.

rep_in_progress: Decoded from bit 7 of the current_dec_ctl state machine.

src_mux_ctl: Decoded from bit 6 of the current_dec_ctl state machine.

rep_mux_ctl: Decoded from bit 5 of the current_dec_ctl state machine.

wait_src: Decoded from bit 4 of the current_dec_ctl state machine.

wait_rep: Decoded from bit 3 of the current_dec_ctl state machine.

wait_fp: Decoded from bit 2 of the current_dec_ctl state machine.

wait_next_src__00: Dedcoded from bit 1 of the current_dec_ctl state machine.

byte1_ahead_avail: There are two compressed word buffers in decode_borg. The four pointers can point to any of the eight locations. If byte1_ahead_avail is true, it says that either the second pointer (read_buf_p1) is pointing to buffer 0 and buffer 0 has valid data in it (used_comp_buf0=1) or that read_buf_p1 is pointing to buffer 1 and buffer 1 has valid data in it (used_comp_buf1=1).

byte2_ahead_avail: There are two compressed word buffers in decode_borg. The four pointers can point to any of the eight locations. If byte1_ahead_avail is true, it says that either the second pointer (read_buf_p2) is pointing to buffer 0 and buffer 0 has valid data in it (used_comp_buf0=1) or that read_buf_p2 is pointing to buffer 1 and buffer 1 has valid data in it (used_comp_buf1=1).

byte3_ahead_avail: There are two compressed word buffers in decode_borg. The four pointers can point to any of the eight locations. If byte1_ahead_avail is true, it says that either the second pointer (read_buf_p3) is pointing to buffer 0 and buffer 0 has valid data in it (used_comp_buf0=1) or that read_buf_p3 is pointing to buffer 1 and buffer 1 has valid data in it (used_comp_buf1=1).

Data Flow Control Signals:

decomp_eoi_b: End of image (eoi) is used to signal downstream components that the current pixel coming out of the decompressor is the last pixel for a strip or image. This flag is set when we are at the last pixel of a line (kstate=1), we are on the last row of a strip (jstate=1) and we are transferring data (decomp_xfer=1).

decomp_eol_b: This is the internal end of line signal. It is asserted when the line counter kstate is at the count of one. Thus this signal is not qualified with a transfer-in-progress, so it will be true whenever the count is at one.

input_available: This signal tells us that current_pointer is pointing to valid data. It is true whenever one of the input buffers is full. used_comp_buf0 for buffer 0 and used_comp_buf1 for buffer1 denote this.

xfer_from_dma: This signal tells us that we are reading a word from the DMA unit.

xfer_from_lb: This signal tells us that we are reading a word from the line buffer.

comp_buf_full: This signal tells that both buffer0 and buffer1 are full.

dma_rd_req_b: This is the request for data to the DMA unit. It is true whenever comp_buf_full is not true, denoting an empty buffer.

lb_rd_req_b: This is the request for data from the line buffer. It is asserted every time we transfer a decompressed byte out, since for every decompression byte we increment ourselves one position forward on the line and thus need a new line buffer value for the next position. We know that we are transferring a decompressed byte out when decomp_ack_b is asserted.

northeast_pixel: The northeast pixel is the pixel that is at the current_pointer plus 1 position in the seedrow. This pixel comes into decode_borg as lb_pixel_p1.

decomp_ack: decomp_ack is the handshake to the downstream unit that a decompressed pixel is available. Because we have to run in lock-step between the line buffer, the input from the DMA (for literals) and the output, most transfers are paced by decomp_ack. It decomp_ack isn't true, most things in decode borg stop. Decomp_ack is also used to prevent some corner cases from occurring. When we are being severely paced by the input compressed data stream (input data comes in very slowly with respect to how fast the unit can put the data out), corner case problems can occur. One example is where the last literal replication of a strip of replication count 0xFF is the last byte of a word. Suppose further that this count is completely extinguished before the next word is brought in. This means that the end of image (decomp_eoi_b) will occur with the last byte of this count. However, current_pointer is not pointing to the last byte of the strip, which is a terminating 0x00. By the time that the next word is brought in and we see that the count is 0x00, a terminating count for the last transfer, it is too late. We don't transfer any more data out so decomp_eoi_b cannot occur and we completely miss the chance to assert it. To get around this problem, we require that we have one full buffer (input_available=1) and that we have at least two valid bytes (byte1_ahead_avail=1). This covers the case where input_available is true due to only one buffer full and that we find ourselves on the last byte of the buffer, with the other buffer not yet full. This condition could lead to the missed end of image as described above. In this case we de-assert decomp_ack until the next word is available. When decomp_ack is not true we are unable to transfer data and thus would not transfer the last byte until the next word was available. With the next word available we would see that the next byte is a terminating 0x00 and would thus assert the end of image correctly. There are two parts to decomp_ack:

For the literal part we check to see that input_available is true and either byte1_ahead_avail is true or one of eoi buffer flags (eoi0_flag or eoi1_flag) is true, as was described above. If these conditions are not met, we can still assert decomp_ack if dma_hold_eoi is true. Suppose the last byte of a word is a literal of one byte and the pixel is not from location 00, and that this command is loaded but decomp_ack goes away due to output pacing. In this case dma_hold_eoi is asserted to denote the fact that the last byte of the file was read but hasn't been output yet. When decomp_ack is asserted next, we will correctly set decomp_eoi on the next pixel output, which is the single literal from the last command. There are several other signals that are checked for the literal part. We make sure we are in literal mode (run=0 and rep_in_progress=1), and we make sure that lb_rd_ack, the acknowledge to the line buffer logic, is asserted. If the line buffer cannot store the output byte, we keep the decompressor from outputting the byte to the downstream unit such that the downstream unit and the line buffer stay in synch.

For the run and seedrow part we check to see that we are either in a run (run=1 and rep_in_progress=1) or a seedrow copy (src_in_progress=1). We again check to see that lb_rd_ack is true, just as we did for the literal case. Finally we make sure that either input_available or dma_hold_eoi is true. Having input_available true tells us that at the end of the current seedrow copy or run replication we can move into another count or another command. dma_hold_eoi tells us that the current seedrow copy or replication is the last action of the image and that when the count runs out we should not worry that we don't have another word (input_available=0) since the current action is the last action required for the image.

decomp_xfer: This signal tells us that we are transferring data to the downstream unit. The downstream unit requests data by asserting decomp_req, and we tell the downstream unit we have data available by asserting decomp_ack. If both are true it is assumed a byte is transferred.

lb_wr_req_b: This signal is exactly the same decomp_ack (described above). The reason that it is the same is that we keep the data going to the line buffer and the data going to downstream unit in synch, and this is a simple solution.

lb_wr_xfer: This signal tells us that we are transferring data to the line buffer. The line buffer says it can receive data by asserting lb_wr_ack. We tell the line buffer we have data available by asserting lb_wr_req. If both are true it is assumed a byte is transferred.

current_byte_wr: This signal represents the current location within a line (kstate).

code_rep_done: This signal is used to determine when a run or literal replacement is completed. This completion could be for either an initial or a subsequent transfer and for counts both equal to, and greater than, one. We make sure that we doing a replication by checking for rep_in_progress being true, and either rep_orig_m1 equal 0, for counts of one, or for rep_count=0x01, for counts greater than one. As will be seen later, rep_count is not updated with the count value until the first transfer occurs. Thus we check for the case of a count of one separately. Finally we look for decomp_xfer to make sure that we are actually transferring the last byte out.

code_src_done: This signal is used to determine when a seedrow copy is completed. This completion could be for either an initial or a subsequent transfer and for counts both equal to, and greater than, one. We make sure that we doing a replication by checking for src_in_progress being true, and either src_orig_m1 equal 0, for counts of one, or for src_count=0x01, for counts greater than one. As will be seen later, src_count is not updated with the count value until the first transfer occurs. Thus we have to check for the case of a count of one separately. Finally we look for decomp_xfer to make sure that we are actually transferring the last byte out.

run: This signal tells us that the current command is either a run or a literal. Remember that a seedrow copy that takes us to the end of the line is coded as a run. If read_command, the pointer that tells us which command ping-pong register to look at, is not asserted (equals 0), run is assigned the most significant bit of the commando register. If read_command is asserted (equals 1), run is assigned the most significant bit of the command1 register.

location: This signal tells us where to capture the first pixel of the run or literal. The value of location is described in Section 1.0 (the overview). If read_command, the pointer that tells us which command ping-pong register to look at, is not asserted (equals 0), run is assigned the bits (6:5) of the commando register. If read_command is asserted (equals 1), run is assigned the bits (6:5) of the command1 register.

src_ini: This signal tells us what the initial seedrow copy count should be for the current command. If read_command, the pointer that tells us which command ping-pong register to look at, is not asserted (equals 0), run is assigned the bits (4:3) of the commando register. If read_command is asserted (equals 1), run is assigned the bits (4:3) of the command1 register.

next_src_ini: This signal looks ahead to the next command buffer and tells us what the initial seedrow copy count will be for that command. If read_command, the pointer that tells us which command ping-pong register to look at, is not asserted (equals 0), run is assigned the bits (4:3) of the command1 register. If read_command is asserted (equals 1), run is assigned the bits (4:3) of the command0 register.

next_location: This signal tells us where to capture the first pixel of the next command. The value of location is described in Section 1.0 (the overview). If read_command, the pointer that tells us which command ping-pong register to look at, is not asserted (equals 0), run is assigned the bits (6:5) of the command1 register. If read_command is asserted (equals 1), run is assigned the bits (6:5) of the commando register.

dec_rep_count: This signal tells us when to increment our byte pointers during a literal or run transfer. The pointers are incremented each time a transfer occurs and we are in a replication. The name is derived from the fact that as we increment the byte pointer we are decrement the replication counter.

src_rep_count: This signal tells us when to increment our byte pointers during a seedrow copy transfer. The pointers are incremented each time a transfer occurs and we are in a seedrow copy. The name is derived from the fact that as we increment the byte pointer we are decrement the seedrow copy counter.

eol_approach: This signal will be true when the next seedrow count equals the number of bytes left on a line and we are in seedrow copy mode. This signal is registered by eol_approach_d until the end of line is reached. We know if we are in a seedrow copy if src_in_progress is true. We check to see that either command_loaded is true or that src_sub_loaded is true. Both of these strobes are true only until the first transfer from them occurs. During the time that one of these strobes is true, we check to see if src_orig equals kstate, the remaining number of bytes in the line. If they are equal and the other strobes are true, this signal is asserted.

Registers:

There are many registers in decode_borg that are used to track the progress of the decompression, either by holding needed values, counts, or control flags. Because these registers are broken out fairly cleanly by the processes they are in, the process name will be used as section headers below.

Input Registers:

current_ptr: This register is a two-bit value that tells us which byte in one of the command buffers is at the head of the queue; i.e. which byte is to be used next. In many of the descriptions above, this signal was called current_pointer (for clarity).

current_ptr_p1: This register is a two-bit value that tells us which byte is second in line, behind the byte pointed to by current_ptr.

current_ptr_p2: This register is a two-bit value that tells us which byte is third in line, behind the byte pointed to by current_ptr_p1.

current_ptr_p3: This register is a two-bit value that tells us which byte is fourth in line, behind the byte pointed to by current_ptr_p2.

load_comp_buf. This single-bit register points to the next buffer which should be loaded with the input data (compressed stream). This bit toggles every time there is a transfer from the DMA (xfer_from_dma=1).

read_comp_buf: This single-bit register points to the buffer should be used to pull data out of. The buffer toggles if one of two conditions occur. The first is if an end of image is encountered. Because all images start on word aligned boundaries, we immediately skip to the next buffer when and eoi occurs so that we are properly positioned for the next stream of input data for the next strip or image. There is one case, though, where this shouldn't occur. If the last byte of the compressed stream is in location 0, and it is a terminating 0x00, we should not toggle read_comp_buf, even though the last byte is not in the buffer pointed to by read_comp_buf. This is because eoi was asserted when the last byte of the buffer pointed to by read_comp_buf was read, i.e. eoi is asserted before we look at the actual last byte. In this case we don't toggle read_comp_buf since the next command will be in the same buffer as that which read_comp_buf points. The last used buffer (which contains the terminating 0x00 which is never actually read) is the buffer not pointed to by read_comp_buf. The second condition occurs based on the current location of the current and the increment strobe that occurs. If current_ptr is pointing at the byte four of the current command buffer and any of the increment strobes occurs (inc_ptr_1, inc_ptr_2, inc_ptr_3, or inc_ptr_4), read_comp_buf_toggles. Likewise if current_ptr is pointing at byte 3 and inc_ptr_2 or inc_ptr_3 or inc_ptr_4 occurs, read_comp_buf toggles. Similar terms exist for current_ptr pointing at either of the first two bytes as well.

comp_buf0: This is a 32-bit register that holds a word of compressed stream data. It is loaded if a transfer from the DMA occurs (xfer_from_dma=1) and the compressed data buffer pointer is pointing to buffer 0 (load_comp_buf=0).

comp_buf1: This is a 32-bit register that holds a word of compressed stream data. It is loaded if a transfer from the DMA occurs (xfer_from_dma=1) and the compressed data buffer pointer is pointing to buffer 0 (load_comp_buf=0).

used_comp_buf0: This flag tells us that the first input compressed data buffer has valid data in it for use by the decompressor. It is set when we are loading the first buffer (load_comp_buf=0) and we are transferring data from the DMA (xfer_from_dma=1). Either an end of image or a data transfer that empties the buffer clears the flag. If we are reading from the first buffer (read_comp_buf=0) and we are pointing at the last byte of the buffer (current_ptr=11) and we increment any amount (1,2,3, or 4), we will use up all of the data in buffer 0 and thus should mark it as unused (empty). If we are pointing at the third byte in the buffer (current_ptr=10) and we increment more than one, we should mark the buffer as unused. Similarly if we are pointing at byte and we increment more than two we should mark the buffer as empty. Similar logic holds for current_ptr=00. Clearing this flag based on end of image involves a corner case. If the last byte of the compressed stream is in location 0, and it is a terminating 0x00, we clear used_comp_buf0, even though we will never actually read from it. This is because eoi was asserted when the last byte of the other buffer was read, i.e. eoi is asserted before we look at the actual last byte. In this case we none-the-less clear the used flag since the next command will be word aligned in the next buffer (preferably, all compressed data streams are word aligned at the start).

used_comp_buf1: This flag tells us that the second input compressed data buffer has valid data in it for use by the decompressor. The logic for this flag is exactly the same as the flag for used_comp_buf0, except that we look at read_comp_buf1 and load_comp_buf1.

read_buf_p1: This flag tells us which of the two compressed word buffers the current_ptr_p1 pointer is pointing to. This flag toggles whenever an increment value occurs that is greater than the position of the current_ptr_p1 pointer. For example, if current_ptr_p1 points to 10 and the pointer increment value is greater than 2, we should toggle this flag to indicate that we are now pointing at 00 (in the next compressed word). We also toggle this flag if an end of image occurs and the same corner case that was described above for read_comp_buf is present.

read_buf_p2: This flag tells us which of the two compressed word buffers the current_ptr_p1 pointer is pointing to. This flag toggles whenever an increment value occurs that is greater than the position of the current_ptr_p1 pointer. For example, if current_ptr_p1 points to 10 and the pointer increment value is greater than 2, we should toggle this flag to indicate that we are now pointing at 00 (in the next compressed word). We also toggle this flag if an end of image occurs and the same corner case that was described above for read_comp_buf is present.

read_buf_p3: This flag tells us which of the two compressed word buffers the current_ptr_p1 pointer is pointing to. This flag toggles whenever an increment value occurs that is greater than the position of the current_ptr_p1 pointer. For example, if current_ptr_p1 points to 10 and the pointer increment value is greater than 2, we should toggle this flag to indicate that we are now pointing at 00 (in the next compressed word). We also toggle this flag if an end of image occurs and the same corner case that was described above for read_comp_buf is present.

eoi0_flag: This flag is set if comp_buf0 contains the last byte of the strip. This is detected if a DMA transfer occurs (xfer_from_dma=1), the DMA is signaling that the current transfer is the last (dma_eoi=1) and we are loading buffer 0 (load_comp_buf=0). This flag is cleared when decomp_eoi_b occurs and the bit is set. Decomp_eoi_b is the flag from Delta to the downstream units that signals the end of image. It is co-incident with the last byte of the strip/image.

eoi1_flag: This flag is set if comp_buf1 contains the last byte of the strip. This is detected if a DMA transfer occurs (xfer_from_dma=1), the DMA is signaling that the current transfer is the last (dma_eoi=1) and we are loading buffer 0 (load_comp_buf=1). This flag is cleared when decomp_eoi_b occurs and the bit is set. Decomp_eoi_b is the flag from Delta to the downstream units that signals the end of image. It is co-incident with the last byte of the strip/image.

last_byte_eoi: This is a two-bit vector that translates the DMA signal last_byte_out to a signal that can be used to determine how many bytes to send out. last_byte_eoi is simply the two least-significant bits of the programmed byte count. However, we need to know which byte of the last word buffer is the last byte of compressed data stream, and this isn't the same as knowing the byte-alignment of the input data size. The mapping is shown below

| last_byte_out | last_byte_eoi |
|---|---|
| 00 | 11 |
| 01 | 10 |
| 10 | 01 |
| 11 | 00 | dma_hold_eoi: This flag is set when there is a seedrow copy or run where we read the last byte many cycles before the last byte is actually transferred out. It is also set when the last byte is a literal command that doesn't have an explicit (location=00) first byte. This flag is cleared if it is set and decomp_eoi_b occurs. It is set when the buffer that we are reading from has its eoi flag set and the amount of data we are reading will be the last data. For example, if eoi0_flag is set, current_ptr_p3 is equal to the last_byte_eoi position, read_buf_p3 is also pointing to buffer 0, we know that current_ptr_p3 is pointing to the last byte. If inc_ptr_p4 occurs, we know that we have just read all of the data in the strip/image, and thus should set the dma_hold_eoi flag.

decomp_leoi_error_b: This flag is set if we are doing a seedrow copy and the src_count is not 0 or if we are doing a replication and the rep_count is not 0 and we are asserting decomp_eoi_b.

Miscellaneous Registers:

west_pixel: The west pixel is the pixel to the left of the current pixel being output, when looked at from a physical page perspective. The west pixel is updated with the current pixel at each transfer out of another decompressed byte (decomp_xfer=1).

cache_pixel: This pixel represents the last non-seedrow copy pixel used. It is updated with the current pixel is decomp_xfer is true and we are not doing a seedrow copy (src_in_progress=0).

first_pixel: This pixel represents the first pixel of the next run or literal replacement. The pointer used to load this byte depends on which load strobe is asserted. If ld_next_fb_src is asserted, we know that we are pointing at the first pixel of the literal or run, because ld_next_fb_src is asserted when we are finishing a seedrow copy and getting ready to a replication. Thus for this strobe we simply store the byte pointed to by current_ptr, current_byte, into first_pixel.

If ld_first_byte is asserted, which occurs when we are in idle waiting for the next command and possible first pixel, we load byte1_ahead into first_pixel. We use byte1_ahead because current_ptr is pointing to the next command, making current_ptr_p1 point to the first byte. If ld_next_fb_run is asserted, we load byte1_ahead as well. ld_next_fb_run tells us that we are finishing a run and are loading a new command and first byte. During a run the current_ptr points to the byte past the last count, and if that byte is a new command, current_ptr_p1 should be pointing at the first byte. We also use byte1_ahead for first_pixel ld_imm_fb is true. This strobe tells us that we are loading a command and a first pixel, and that the current_ptr is pointing at the next command since ld_imm_fb is true only if a literal of length one is encountered. In this case current_ptr is pointing one past the last pixel, which in this case is the next command. Finally, we use byte1_ahead if ld_fb__00_src is asserted. In this case we are finishing a seedrow copy, but that seedrow copy has a terminating 0x00. This means that current_ptr will be pointing at the 0x00, making current_ptr_p1 point to the first byte of the following replication.

We use byte2_ahead if ld_next_fb_lit is asserted. This strobe is asserted if we are finishing a literal and current_ptr is pointing to the last pixel. This makes current_ptr_p1 point to the next command and current_ptr_p2 point to the next first byte. We also use byte2_ahead if ld_next_imm_fb is asserted. When this strobe is asserted, we are finishing up a long literal replacement where the final replacement count was one. current_ptr points to the last literal byte, current_ptr_p1 points to the next command, and current_ptr_p2 points to the next first byte. The assertion of ld_next_fb__00_src tells us that we are doing a seedrow copy that ends a line and that we are loading the next first byte associated with a new command. In this case current_ptr is pointing to the terminating 0x00, current_ptr_p1 is pointing to the next command, and current_ptr_p2 is pointing to the next first byte.

If ld_next_fb__00_rep is asserted, we know that we are loading a new first byte for a new command because we finished a replication that ended in a terminating 0x00. If the replication is a literal, current_ptr will be pointing at the last pixel, current_ptr_p1 will be pointing at the 0x00, current_ptr_p2 will be pointing at the next command, and current_ptr_p3 will be pointing at the next first pixel. This means that for this case we will use byte3_ahead to load first pixel with. If the replication is a run, current_ptr will be pointing at 0x00, current_ptr_p1 will be pointing at the next command and current_ptr_p2 will be pointing at the next first pixel. In this case we will load first_pixel with byte2_ahead.

first_pixel_loaded: This flag tells us that we have loaded a first pixel and can proceed into a replication. This flag is set if loading_first_command is set true. It is cleared on the first byte of the replication (first_pixel_loaded, rep_in_progress, and decomp_xfer all true) and we are not already loading a new first pixel due to an immediate load strobe (loading_first_pixel false).

rep_ini_fp: This flag tracks the loading of each command so that we can know when the first initial replication byte is to be sent out. This allows us to send the correct first pixel based on the location requested. This flag is set when a command is loaded (loading_command=1). It is cleared as soon as the first pixel is sent. The state machine being in state write_rep_ini and decomp_xfer being asserted denotes this. If code_rep_done is true we do not clear this flag because it means that the next pixel out of a replication will be another first pixel.

Src (Seedrow Copy) Registers current_dec_ctl: The state machine flip flops.

cmd0: This is the first of two registers that hold command bytes. We use two registers here so that we can work ahead, loading the next command while we are still working on the current command. For each of the load cases covered below, we make sure that we are current loading buffer 0 (load_command=0) before we actually load the cmd0 buffer. The logic used to used to load this register is much like that logic used to load first pixel.

If ld_cmd is true, we are sitting in idle waiting for valid data. Current_ptr will be pointing at the first valid byte, which will be the next command. Thus we use current_byte to load cmd0 with. We also use current_byte if ld_next_cmd_run is true. Here we are currently doing a run, making first pixel point at the next command past the last run count. This byte will be the next command. If ld_imm_cmd is true we use current_byte as well. ld_imm_cmd describes the case where we have a literal command of one byte. If that happens, we know that we loaded the command the first (and only) pixel before the command was executed. Thus the current_ptr is pointing to the next command. If we are loading the next command the current command is a literal (ld_next_cmd_lit=1) and we are replicating initial bytes (rep_mux_ctl=0) and there is only one byte to replicate (rep_org_m1=0), we use current_byte to load cmd0. This is due to the fact that current_ptr is already past the last pixel of the literal since there was only one pixel and it was loaded with the last command.

If ld_next_cmd_lit is true but we aren't both replicating initial bytes and have only one byte to replicate, we load up cmd0 with byte1_ahead. In this case current_ptr is pointing at the last literal and current_p- tr_p1 is pointing at the next byte past the last literal, which is the next command. If ld_next_cmd__00_rep is true and run is true, we use byte1_ahead to load cmd0 with. Here current_ptr is pointing at the terminating 0x00 and current_ptr_p1 is pointing at the next byte, which is a command. If ld_next_cmd__00_src is true we use byte1_ahead because the current_ptr will be pointing at the terminating 0x00 and current_ptr_p1 will be pointing to the next byte, which is the next command. Finally, we use byte1_ahead if ld_next_imm_cmd is asserted. This strobe is asserted if we are replicating a subsequent literal count of one and will immediately load the next command. In this case current_ptr will be pointing to the last literal, making current_ptr_p1 point to the next byte past the last literal, which is the next command.

If ld_next_cmd__00_rep is true and we are in a literal replacement, we use byte2_ahead. In this case current_ptr is pointing at the last pixel, current_ptr_p1 is pointing at the terminating 0x00, and current_ptr_p2 is pointing at the next command.

command_loaded: This flag tells us that we have a valid command loaded. This bit is set if we are currently loading a new command (loading_command asserted). This bit is cleared if it is set and decomp_xfer occurs, signaling the first byte decompressed for this current command. However, we do gate this with loading_command, which should not be asserted. In this manner we make sure we are not in a corner case where we have back to back commands, and as we load the next command the current command is causing one byte to be output by the decompressor. In this case, we keep command_loaded true, even though we are sending out the first (and in this case only) byte, since we are, at the same time, loading a new command.

src_sub0: This is the first of two ping-pong registers that track the amount of counts required by the subsequent count. If ld_src_subsqnt is true, denoting that a subsequent count is being loaded, and load_src_sub is 0, denoting that we should be loading src_sub0, this register is loaded with what is in current_byte.

src_sub_loaded: This flag tells us that we have loaded a subsequent count. It is set true when ld_src_subsqnt occurs, and is cleared as soon as we have sent out the first seedrow copy byte.

src_count: This counter keeps track of how many bytes we have sent out of seedrow data. This counter is loaded with the original seedrow copy count (minus 1) after the first seedrow copy byte has been sent downstream. We don't load this counter with the original value because the original value might or might not be transferred with data, and data transfer is how this unit keeps in pace with itself. Thus src_count is not loaded until the first seedrow copy of the next count occurs. Otherwise on each transfer we decrement this count. This decrementing is signaled by dec_src_count.

block__00_src_d: This flag is the registered version of block__00_src, which occurs when we encounter an initial count of 0x03 followed no other counts, or we encounter a subsequent count of 0xff followed by no other counts. We keep this asserted until replication begins or we reach the end of line.

eol_approach_d: This flag is a registered version of eol_approach, which tells us that a seedrow copy is going to take us all the way to the end of the line. This prevents us from attempting to load replication information and instead allows us to load the next command.

mux ctl.

src_orig: This register contains the current seedrow copy count. If we are in subsequent seedrow copy mode this signal contains src_sub0 if read_src_sub is 0, else it contains src_sub1. If we are in initial seedrow copy mode, then this signal contains the bits (6:5) of the cmd0 register if read_command is 0, else it contains the bits (6:5) of the cmd1 register.

rep_orig: This register contains the current replication copy count. If we are in subsequent replication mode this signal contains rep_sub0 if read_rep_sub is 0, else it contains rep_sub1. If we are in initial replication mode, then this signal contains a modified version of the bits (2:0) of the cmd0 register if read_command is 0, else it contains a modified version of the bits (6:5) of the cmd1 register. The modification come from the fact that the replication count in the command is one less than the actual count for literal replacements and is two less than the actual count for run replications. The signal cmd0_p1 is the bits (2:0) of cmd0 register with one added to them. cmd0_p2 is the bits (2:0) of the cmd0 register with 2 added to them.

Mux (Multiplex) Data:

current_byte: This signal contains the next byte to be used by the decompressor logic. If read_comp_buf is not asserted, it reads from the first compression buffer, comp_buf0, else it reads from comp_buf1. Which byte it reads is dictated by the pointer current_ptr.

byte1_ahead: Exactly the same as current byte, except that it is read data based on where current_ptr_p1 is pointing, and it reads the buffer pointed to by read_buf_p1.

byte2_ahead: Exactly the same as current_byte, except that it reads data based on where current_ptr_p2 is pointing, and it reads the buffer pointed to by read_buf_p2.

Byte3_ahead: Exactly the same as current_byte, except that it reads data based on where current_ptr_p3 is pointing, and it reads the buffer pointed to by read_buf_p3.

Rep (Replacement) Registers.

rep_sub0: This register is the first of two ping-pong registers used to store the count for subsequent replications. It is loaded with current_byte when ld_rep_subsqnt is asserted, run is asserted, and load_rep_sub is zero, indicating that rep_sub0 is the register that should be loaded next. Notice that for a run current_ptr is pointing at the next byte, which in this case is the next subsequent count. If ld_rep_subsqnt is asserted and we are not in a run, we load from byte1_ahead. We used byte1_ahead in this case because current_ptr is pointing at the last literal pixel, making current_ptr_p1 point to the next count.

rep_sub_loaded: This flag denotes that a subsequent replication count has been loaded. It is set by ld_rep_subsqnt being asserted, and is cleared when the first subsequent count is sent out.

rep_count: This register contains the replication count amount. It is loaded with the rep_orig value minus one, as it is not loaded until the first transfer occurs. Again, as with src_count, this register is not loaded until a data transfer occurs so that we can maintain an easy synchronization with the rest of the logic. If dec_rep_count occurs, rep_count is decremented by one.

block__00_rep_d: This is a buffered version of block__00_rep, which occurs when we encounter an initial count of 7 (initial) or 255 (subsequent) followed by no other counts. We keep this asserted until replication begins or we reach the end of line.

run_pixel_d: This is a registered version of the run_pixel, which is the first pixel of a run. When first_pixel_loaded is asserted, we load run_pixel_d with run_pixel. First_pixel will change after the first_pixel_loaded flag is deasserted, so run_pixel_d is what we assign the decompressed byte at all other times except the first pixel of a run.

State Machine:

Contrary to the process name, this process contains the next ptr assignments for the current_ptr pointers.

next_ptr: when eoi occurs, we want current_ptr to point to location 00, so we assign next_ptr to first_byte, which is 00. If inc_ptr_3 occurs, we assign next_ptr to fourth_byte, because we will want current_ptr to be pointing to 11. If inc_ptr_2 occurs, we assign next_ptr to third_byte, because we will want current_ptr to be pointing to 10. Finally, if inc_ptr_1 occurs, we assign next_ptr to second_byte, because we will want current_ptr to be pointing to 01.

next_ptr_p1: The same logic used in next_ptr is used here, except that at eoi we want to assign next_ptr_p1 to second_byte, because current_ptr_p1 should, at the start, be one ahead of current_ptr.

next_ptr_p2: The same logic used in next_ptr is used here, except that at eoi we want to assign next_ptr_p2 to third_byte, because current_ptr_p1 should, at the start, be two ahead of current_ptr.

next_ptr_p3: The same logic used in next_ptr is used here, except that at eoi we want to assign next_ptr_p3 to fourth_byte, because current_ptr_p1 should, at the start, be three ahead of current_ptr.

Data Out:

decomp_byte_b: This is the decompressed data bus to the downstream unit. We select what to output based on what state we are currently in.

If we are in the initial seedrow copy state (write_src_ini=1) and we are not on the first row, we assign lb_pixel to decomp_byte_b. lb_pixel is the data byte from the line buffer that represent the seedrow byte directly above our current line position. If we are on the first row, we assign first_row_byte to decomp_byte_b. first_row_byte is a configurable register which tells us what the first row byte should be. This allows us to get better compression, since we can preset what the background might be.

If we are in the subsequent seedrow copy state (write_src_sub=1) we do exactly the same thing as for the write_src_ini case.

If we are in the initial replication state (write_rep_ini=1) we have to check to more flags. If rep_ini_fp is true, we know that we should be outputting the first pixel, which is selected by location. It will be first_pixel if location is 00; it will be west_pixel if location is 01; it will be northeast_pixel if location is 10; it will be cache_pixel if location is 11. If rep_ini_fp is not true and we are not in halftone replication mode and we are in a run, the output byte will be run_pixel. If we are in halftone replication mode and run is true we will send out ht_pixel. If none of the above conditions are true we are in literal mode. In this case we send out current byte on decomp_byte_b.

If we are in write_rep_sub state (write_rep_sub=1) and we are not in halftone replication mode and we are in a run, the output byte will be run_pixel. If we are in halftone replication mode and run is true we will send out ht_pixel. If none of the above conditions are true we are in literal mode. In this case we send out current byte on decomp_byte_b.

run_pixel: run_pixel is assigned west_pixel, northeast_pixel, cache_pixel, or first_pixel based on location if first_pixel_loaded is true. After the first pixel has been sent out, first_pixel_loaded will not be true. After first_pixel_loaded is de-asserted, run_pixel is assigned run_pixel_d.

Although the disclosure has been described in language specific to structural features and/or methodological steps, it is to be understood that the appended claims are not limited to the specific features or steps described. Rather, the specific features and steps are exemplary forms of implementing this disclosure. For example, while red, green and blue have been used as the basis for color printing, it is understood that magenta, cyan and yellow or other colors could be substituted. Additionally, while a substantial amount of specific information has been disclosed to describe an enabled version, alteration to this information could be made while still in following the teachings herein disclosed.

Additionally, while one or more methods have been disclosed by means of flow charts and text associated with the blocks, it is to be understood that the blocks do not necessarily have to be performed in the order in which they were presented, and that an alternative order may result in similar advantages.

The invention claimed is:

1. An ASIC, comprising:
 a DMA arbiter to parse color plane data, sending each color plane's data to a DMA associated with each color plane;
 a compressor, to receive color plane data from the DMA associated with each color plane and to compress color data in runs, seedrow copies and literals, thereby forming compressed data;
 a decompressor to decompress the compressed data, the decompressor comprising:
 a decompressor core to direct data decompression;
 a state machine, operating within the decompressor core, to recognize and decompress runs, seedrow copies and literals; and
 a look-ahead buffer to contain compressed pixel data for use in loading Boolean equations within sequence of prioritized equations within the state machine; wherein the decompressor is configured to decompress data at one pixel per clock cycle of the ASIC.

2. The ASIC of claim 1, wherein the compressor additionally comprises:
 a data interleaver to interleave color plane data in a format comprising RGBR, GBRG and BRGB sequences.

3. The ASIC of claim 1, wherein the compressor comprises:
 a compression controller to determine if the color plane data should be compressed as a run, seedrow copy or as a literal.

4. The ASIC of claim 3, wherein the compressor additionally comprises:
 a run command unit to compress runs in the color plane data;
 a seedrow copy unit to compress seedrow copies in the color plane data; and
 a literal unit to process literals in the color plane data.

5. The ASIC of claim 1, wherein the compressor comprises:

an entropy module, instantiated in each color plane as an indicator of compression effectiveness, which counts changes between sequential pixels to measure entropy on a line basis, and which averages together multiple lines to broaden the indicator.

6. The ASIC of claim 1, wherein the decompressor is configured to output one pixel each and every clock cycle during decompression of data.

* * * * *

UNITED STATES PATENT AND TRADEMARK OFFICE
CERTIFICATE OF CORRECTION

PATENT NO. : 7,532,358 B2
APPLICATION NO. : 10/341821
DATED : May 12, 2009
INVENTOR(S) : Scott C. Clouthier et al.

It is certified that error appears in the above-identified patent and that said Letters Patent is hereby corrected as shown below:

In column 11, line 1, delete "614C" and insert -- 614G --, therefor.

In column 13, line 45, delete "Id" and insert -- ld --, therefor.

In column 13, line 57, delete "id" and insert -- ld --, therefor.

In column 13, line 63, delete "comer" and insert -- corner --, therefor.

In column 13, line 66, delete "Id" and insert -- ld --, therefor.

In column 14, line 26, delete "Id" and insert -- ld --, therefor.

In column 22, line 18, delete "Id" and insert -- ld --, therefor.

In column 23, line 1, delete "id" and insert -- ld --, therefor.

In column 23, line 11, delete "Id" and insert -- ld --, therefor.

In column 23, line 22, delete "id" and insert -- ld --, therefor.

In column 24, line 46, delete "Dedcoded" and insert -- Decoded --, therefor.

In column 25, line 50, delete "comer" and insert -- corner --, therefor.

In column 27, line 26, delete "commando" and insert -- command0 --, therefor.

In column 27, line 35, delete "commando" and insert -- command0 --, therefor.

In column 27, line 43, delete "commando" and insert -- command0 --, therefor.

In column 27, line 61, delete "commando" and insert -- command0 --, therefor.

In column 31, line 38, insert -- if -- before "ld_imm_fb".

In column 34, line 20, delete "cmdO_pl" and insert -- cmd0_pl --, therefor.

Signed and Sealed this

Sixth Day of July, 2010

David J. Kappos
*Director of the United States Patent and Trademark Office*